US011566448B2

(12) United States Patent
Leigh et al.

(10) Patent No.: US 11,566,448 B2
(45) Date of Patent: Jan. 31, 2023

(54) LOCK FOR FACEPLANE INFRASTRUCTURE

(71) Applicant: HEWLETT PACKARD ENTERPRISE DEVELOPMENT LP, Houston, TX (US)

(72) Inventors: Kevin B. Leigh, Houston, TX (US); Everett R. Salinas, Pasadena, TX (US); John R. Grady, Cypress, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 349 days.

(21) Appl. No.: 16/819,298

(22) Filed: Mar. 16, 2020

(65) Prior Publication Data

US 2021/0285258 A1  Sep. 16, 2021

(51) Int. Cl.
  *E05B 65/00*  (2006.01)
  *E05B 47/00*  (2006.01)
  *H05K 7/14*  (2006.01)

(52) U.S. Cl.
  CPC ......... *E05B 65/00* (2013.01); *E05B 47/0001* (2013.01); *E05B 47/0002* (2013.01); *H05K 7/1489* (2013.01); *E05B 2047/0072* (2013.01)

(58) Field of Classification Search
  CPC .. E05B 65/00; E05B 47/0001; E05B 47/0002; E05B 2047/0072; H05K 7/1489
  See application file for complete search history.

(56) References Cited

U.S. PATENT DOCUMENTS

| 4,679,368 | A | * | 7/1987 | Pettinga | E04B 2/7416 403/252 |
| 5,964,611 | A | * | 10/1999 | Jacob | H01R 13/639 439/942 |
| 6,009,224 | A | | 12/1999 | Allen | |
| 7,585,005 | B1 | * | 9/2009 | Cote | E05C 1/10 312/265.5 |
| 8,625,950 | B2 | | 1/2014 | Beamon et al. | |
| 8,718,436 | B2 | | 5/2014 | Barnes et al. | |
| 8,851,529 | B2 | * | 10/2014 | Chiang | H05K 5/0221 292/156 |
| 9,140,869 | B2 | | 9/2015 | Julien et al. | |
| 9,817,201 | B2 | | 11/2017 | Lee et al. | |
| 9,848,702 | B2 | * | 12/2017 | Chen | H05K 7/1489 |

(Continued)

OTHER PUBLICATIONS

Optoconnect Rack-mount Fiber Enclosures and Cassettes, (Web Page), Retrieved Oct. 21, 2019, 9 Pgs.

*Primary Examiner* — Mark A Williams
(74) *Attorney, Agent, or Firm* — Nolte Intellectual Property Law Group

(57) ABSTRACT

A lock mechanism for a faceplane infrastructure coupled externally from a faceplate of a modular device includes a locking bar, a locking bar engagement element, and a securing device. When the lock mechanism is assembled and in a locked state, the locking bar is housed within the modular device. Further, when the lock mechanism is assembled and in the locked state, the locking bar engagement element is fixedly coupled to a first portion of the faceplane infrastructure and removably engaged with the locking bar through an aperture in the faceplate of the modular device. Moreover, when the lock mechanism is assembled and in the locked state, the securing device locks the first portion of the faceplane infrastructure to the faceplate of the modular device.

19 Claims, 21 Drawing Sheets

(56) References Cited

U.S. PATENT DOCUMENTS

| | | | |
|---|---|---|---|
| 9,877,407 B1* | 1/2018 | Sim | H04Q 1/06 |
| 10,285,291 B1* | 5/2019 | Lam | H05K 5/0295 |
| 2006/0092246 A1 | 5/2006 | Kato et al. | |
| 2009/0135559 A1* | 5/2009 | Adducci | H04Q 1/064 |
| | | | 361/692 |
| 2018/0177069 A1* | 6/2018 | Dennison | H05K 7/1489 |
| 2019/0098788 A1* | 3/2019 | Leigh | H05K 7/1492 |
| 2020/0107461 A1* | 4/2020 | Chia | H05K 5/0065 |
| 2021/0372171 A1* | 12/2021 | Valdes Rudd | E05B 81/08 |

* cited by examiner

LOCK FOR FACEPLANE INFRASTRUCTURE

BACKGROUND

Computing systems, such as server assemblies, include one or more electronic devices. For example, an electronic device may include a modular device. The modular device may be inserted into a frame and/or rack cabinet to form a part of a computing system. To facilitate communication, e.g., optical communication, within a modular device or between modular devices within the computing system, faceplane infrastructure may be used. Faceplane infrastructure includes infrastructure that is coupled external from a modular device, such as being coupled to a rack cabinet that holds the modular device. The faceplane infrastructure communicatively couples to the modular device through a faceplate of the modular device.

BRIEF DESCRIPTION OF THE DRAWINGS

The present disclosure is best understood from the following detailed description when read with the accompanying drawings. Features of the present disclosure are illustrated by way of example and not limited in the following figures, in which like numerals indicate like elements, in which.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

In an example, a computing system may include an enclosure that houses multiple modular devices. A modular device may have a faceplate to expose optical connections, and optical infrastructure may interface to the optical connections on each modular device to connect among a plurality of modular devices. Multiple enclosures may be arranged in vertically adjacent positions within a rack cabinet. Modular devices may be interconnected within an enclosure or across a plurality of enclosures within a rack cabinet by means of the optical infrastructure interfacing to the optical connections of the modular devices. Namely, the optical infrastructure, such as optical cables, may be routed external from the modular device using faceplane infrastructure. The faceplane infrastructure communicatively couples the optical infrastructure to circuitry (e.g., electronic, photonic, and/or opto-electronic circuitry) within the modular device through a faceplate of the modular device. However, the external coupling through the faceplane infrastructure may expose the optical infrastructure to inadvertent, unauthorized, or malicious tampering.

A lock mechanism according to the present disclosure may be used to lock at least a portion of the faceplane infrastructure. In an example, the lock mechanism includes a locking bar, a locking bar engagement element, and a securing device. When the lock mechanism is assembled and in a locked state, the locking bar is housed within the modular device. Further, when the lock mechanism is assembled and in the locked state, the locking bar engagement element is fixedly coupled to a first portion of the faceplane infrastructure and removably engaged with the locking bar through an aperture in a faceplate of the modular device. Moreover, when the lock mechanism is assembled and in the locked state, the securing device locks the first portion of the faceplane infrastructure to the faceplate of the modular device.

Figure 1:
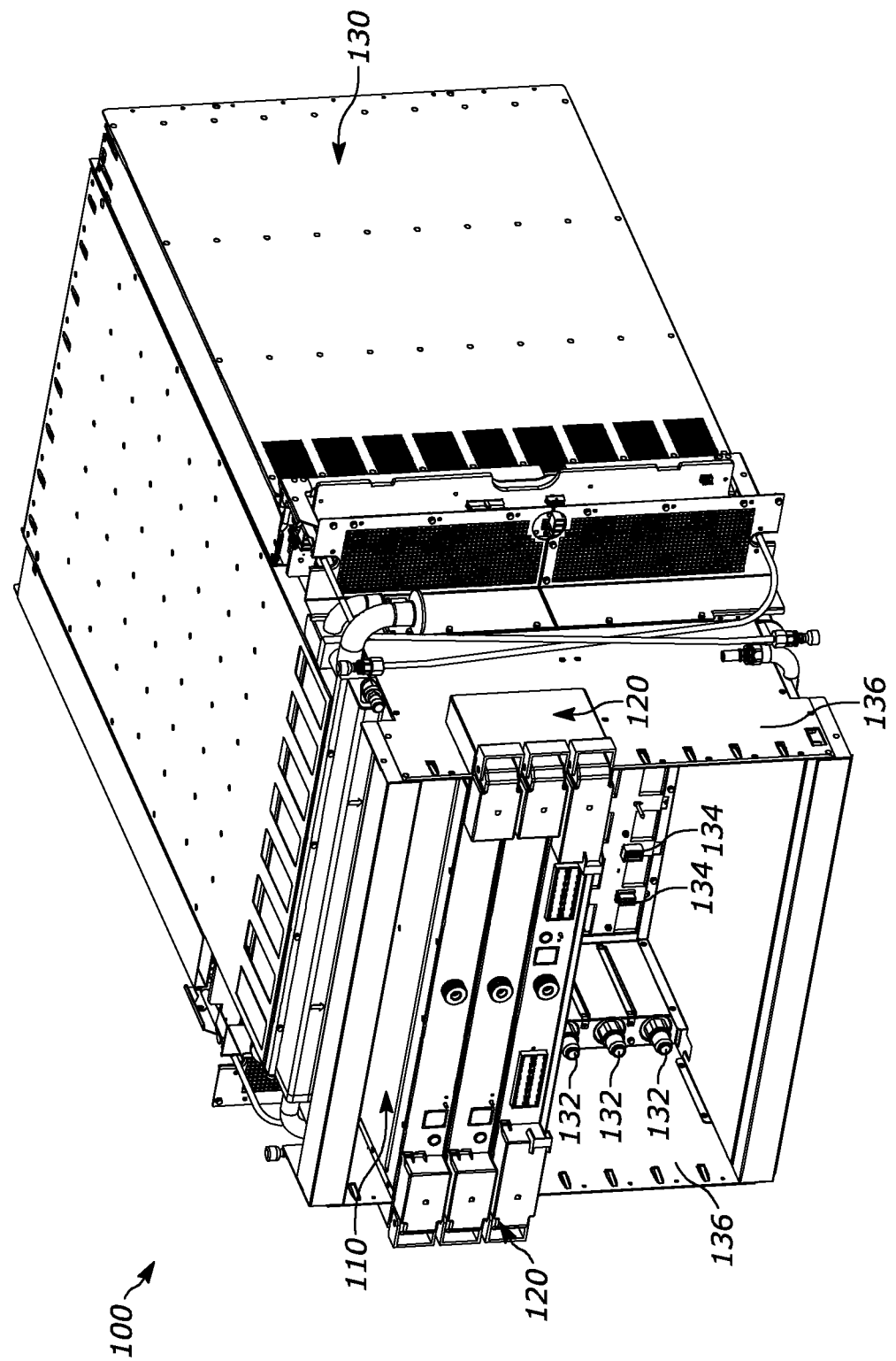
FIGS. 1-1A is a perspective views of an electronic device having a lock mechanism for faceplane infrastructure, according to one or more examples of the present disclosure.
Figure 4:
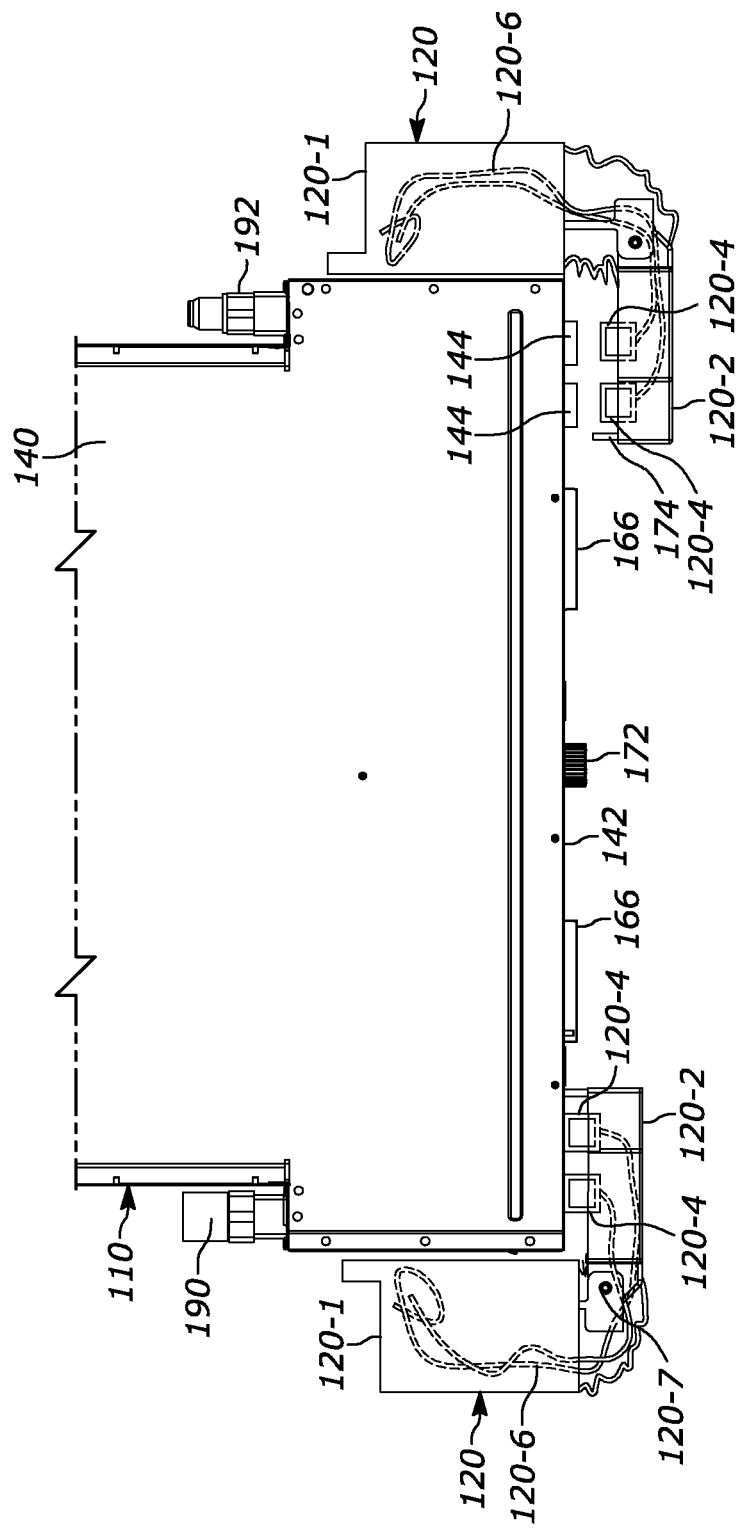
FIG. 4 is a partial, plan, top view of the modular device assembly and swing-arm assemblies shown in FIGS. 1-3, according to one or more examples of the present disclosure.
Figure 5:
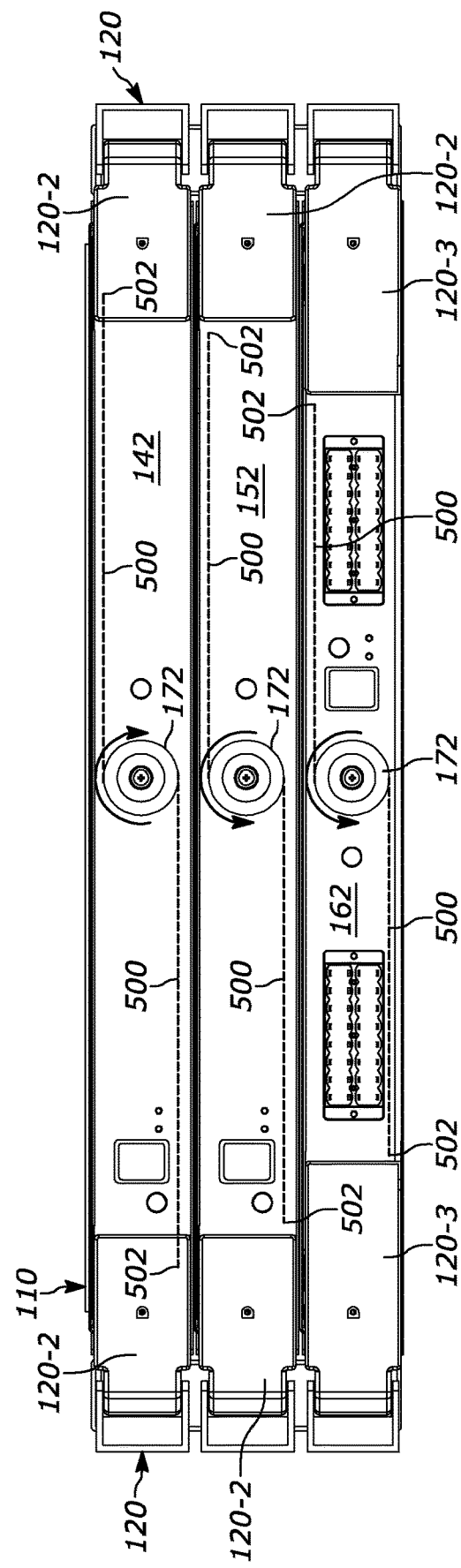
FIG. 5 is a front, plan view of the modular device assembly and swing-arm assemblies shown in FIGS. 1-4, according to one or more examples of the present disclosure.

Turning now to the drawings, FIG. 1 is a perspective view of an electronic device 100 having a lock mechanism for faceplane infrastructure, according to one or more examples of the present disclosure. Electronic device 100 includes a modular device assembly 110, two swing-arm assemblies 120, and an enclosure 130, which may also be referred to as a frame. Additional details of the modular device assembly 110 and the swing-arm assemblies 120 are illustrated by reference to FIGS. 2-3, which are enlarged perspective views of the modular device assembly 110 and the swing-arm assemblies 120. Still further details may be had by reference to FIG. 4, which is a partial top view of the modular device assembly 110 and the swing-arm assemblies 120. Moreover, some details of the lock mechanism included within the electronic device 100 are described by reference to FIGS. 2-5. FIG. 5 is a front view of the modular device assembly 110 and the swing-arm assemblies 120.

As illustrated, the enclosure 130 houses the modular device assembly 110, for instance to couple the modular device assembly 110 to a computing system (not otherwise shown). The computing system may include one or more additional modular device assemblies 110 within the enclosure 130 and/or one or more additional enclosures 130. The multiple enclosures may be housed within one or more rack cabinets, depending on the size of the computing system. In an example, the computing system may be a server assembly that includes multiple modular servers. In another example, the computing system may be a switch assembly that include multiple modular switches. In yet another example, the computing system may be a mix of modular servers, accelerator devices, storage devices, and switches.

Figure 1A:
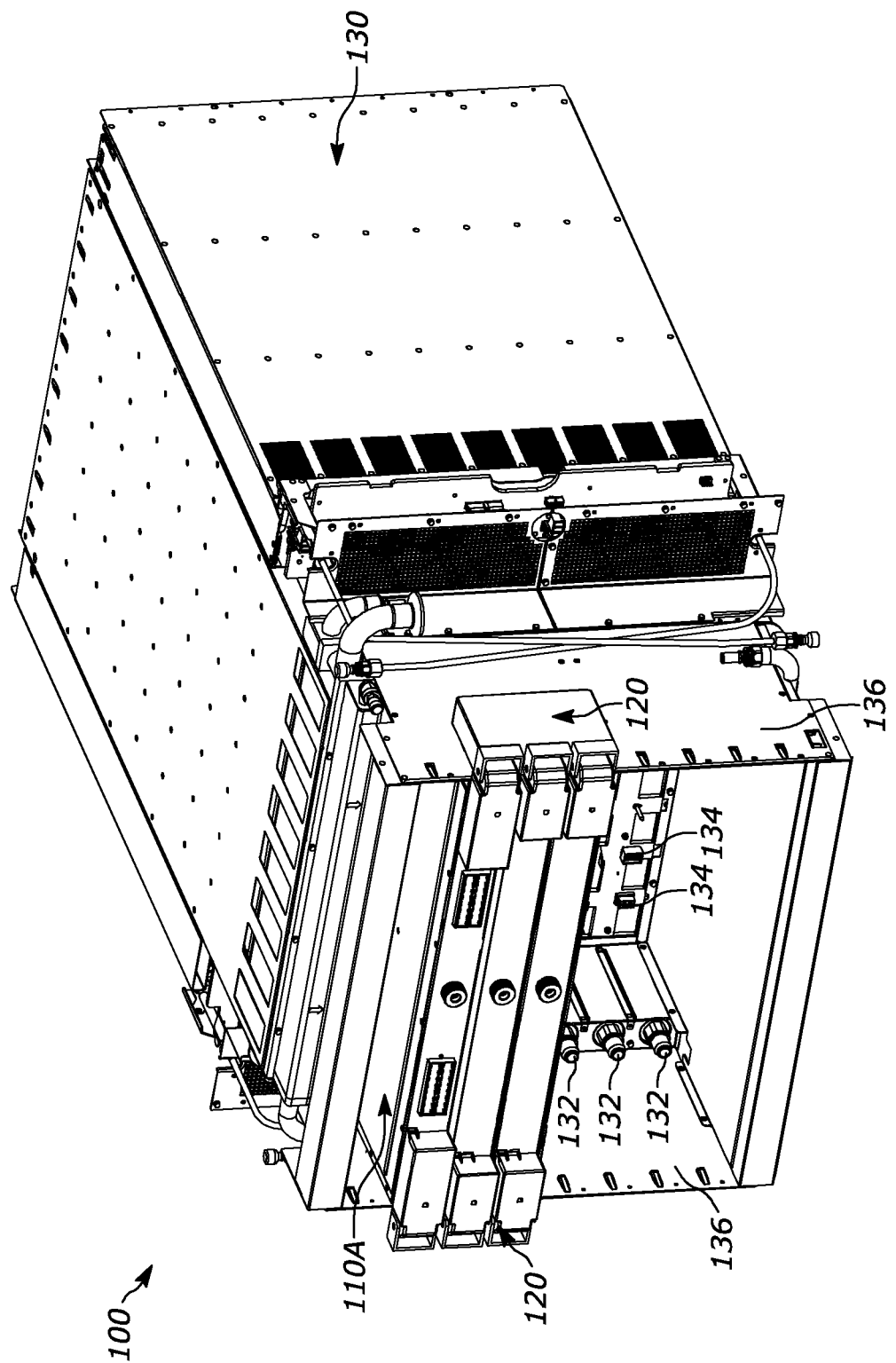

In a further example, the position of modular devices may be switched within the modular device assembly 110. FIG. 1A illustrates the electronic device 100 having such a modular device assembly 110A. The modular device assembly 110A may be implemented in part by installing the swing-arm assemblies 120 in different rotational positions. Components of the swing-arm assemblies 120 (e.g., a plenum and swing-arms), faceplates, and components of lock mechanisms (e.g., locking bars within each modular device and locking bar engagement elements fixedly coupled to the swing-arms) may be symmetrical to allow the flexible arrangement of the modular devices. Flexible positioning of modular devices and swing-arm assemblies may allow flexibility for routing cables, e.g., fiber cables, and/or placement of electrical connectors with a computing system.

Returning to the description of FIG. 1, various connectors of the enclosure 130 may be used to couple the modular device assembly 110 into the computing system. In the example illustrated, the connectors of the enclosure 130 include liquid couplers 132 (three shown). Some of the liquid couplers 132 may blind mate to complementary liquid couplers (not shown in FIG. 1) of the modular device assembly 110. The mated liquid couplers 132 allow the circulation of liquid coolant through the modular device assembly 110 to cool electronics and/or opto-electronics therein. Thus, in this particular example electronic device 100, the modular device assembly 110 is liquid cooled, wherein space on faceplates may be liberally utilized by faceplane infrastructure. However, other example electronic devices using alternative cooling techniques, e.g., air cooling, may implement lock mechanisms as described herein.

The enclosure 130 further includes connectors 134 (two shown). Some of the connectors 134 may blind mate with electrical connectors (not shown in FIG. 1) of the modular device assembly 110. The mated electrical connectors may allow power connection and electrical communication within the modular device assembly 110 and/or between the modular device assembly 110 and the rest of a computing system (not shown).

As further illustrated, each swing-arm assembly 120 is coupled to a side 136 of the enclosure 130. In another example, there may be a single swing arm-assembly 120 coupled to one of the sides 136. In yet another example, where the enclosure 130 is housed within a rack cabinet (not shown), the swing-arm assemblies 120 may be coupled to one or both sides of the rack cabinet at the front or the rear of the rack cabinet. The swing-arm assemblies 120 may be installed using any suitable attachment mechanism, such as one or more fasteners.

The swing-arm assemblies 120 are example apparatus that may be implemented as faceplane infrastructure coupled externally from the modular device assembly 110. In a particular example, the faceplane infrastructure implemented by the swing-arm assemblies 120 is an optical faceplane infrastructure that allows optical communication through faceplates of modular devices included in the modular device assembly 110. Accordingly, the swing-arm assemblies 120 may include optical infrastructure (not shown in FIG. 1), e.g., optical fibers and/or cables, which allow optical communication within the modular device assembly 110 and/or between the modular device assembly 110 and the rest of a computing system (not shown).

When implemented as optical faceplane infrastructure, the swing-arm assemblies 120 allow an independent optical infrastructure add-on to an electrical infrastructure within the modular device assembly 110 and/or between the modular device assembly 110 and the enclosure 130. However, in another example, the swing-arm assemblies 120 may be implemented as electrical faceplane infrastructure that allows an independent electrical infrastructure add-on to an optical infrastructure within the modular device assembly 110 and/or between the modular device assembly 110 and the enclosure 130.

Figure 2:
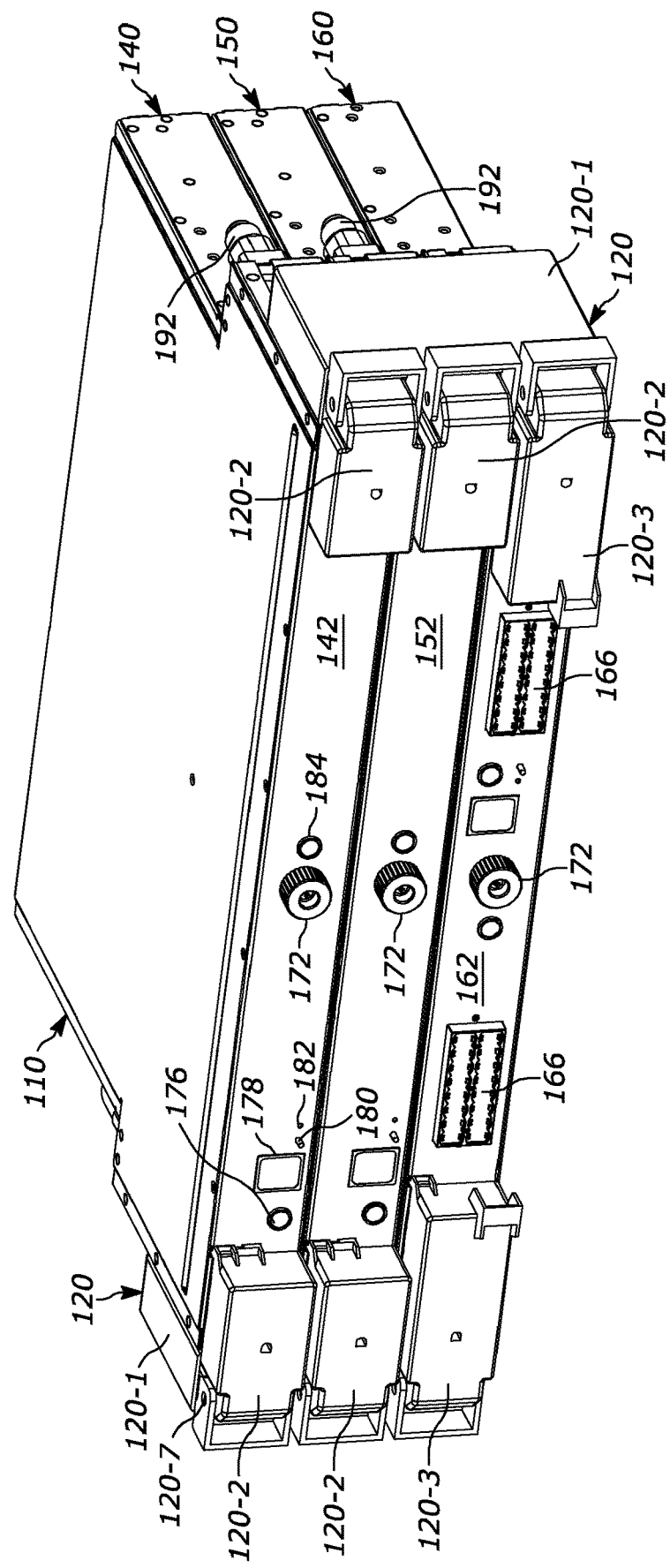
FIG. 2 is an enlarged perspective view of the modular device assembly and swing-arm assemblies shown in FIG. 1, according to one or more examples of the present disclosure.
Figure 3:
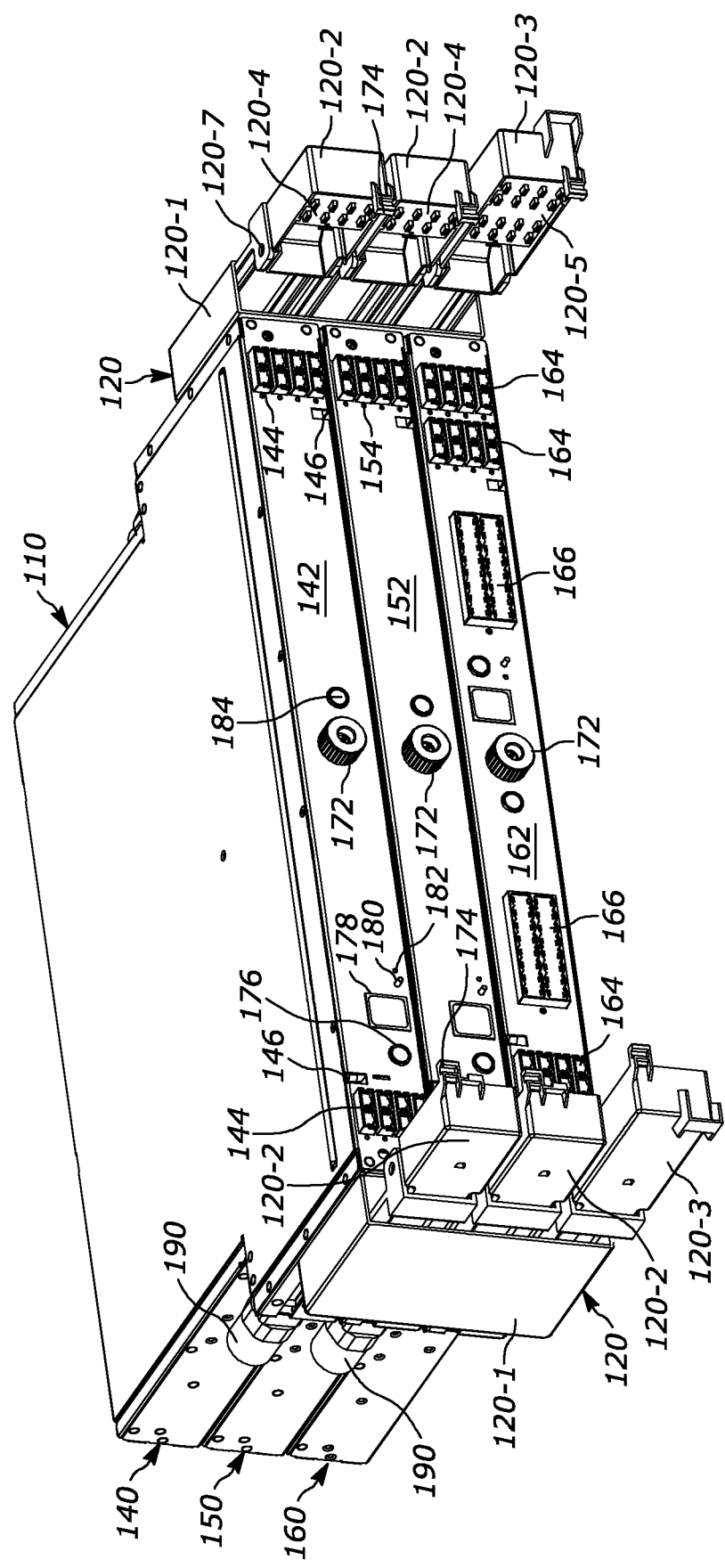
FIG. 3 is another enlarged perspective view of the modular device assembly and the swing-arm assemblies shown in FIG. 1, according to one or more examples of the present disclosure.

As further illustrated in FIGS. 2-3, the modular device assembly 110 includes three modular devices 140, 150, and 160, which may be separately removed from the modular device assembly 110. Types of modular devices may include a compute tray, a switch tray, or a fiber shuffle tray, as examples. As particularly illustrated, the modular devices 140 and 150 are switch trays, and the modular device 160 is a fiber shuffle tray. As such, the modular devices 140 and 150 may include liquid couplers 190 that may blind mate with the liquid couplers 132 of the enclosure 130 to allow the flow of liquid coolant into the modular devices 140 and 150 to cool electronics therein. The modular devices 140 and 150 may also include liquid couplers 192 that may blind mate with other liquid couplers (not shown) of the enclosure 130 to allow the flow of heated liquid coolant out of the modular devices 140 and 150.

There are three modular devices 140, 150, and 160 included in the modular device assembly 110. However, the type, number, and/or positioning of the modular devices within a modular device assembly may be changed depending, for instance, on the type of computing system within which the modular device assembly is included. In one example, the modular device assembly may include a plurality of the same type of modular device, such as a plurality of compute trays or a plurality of switch trays.

The modular device 140 includes a faceplate 142 that covers an opening (not shown) of the modular device 140. The modular device 140 further includes two sets of connectors 144 coupled near opposite ends of the faceplate 142. The modular device 150 includes a faceplate 152 that covers an opening (not shown) of the modular device 150. The modular device 150 further includes two sets of connectors 154 coupled near opposite ends of the faceplate 152. The modular device 160 includes a faceplate 162 that covers an opening (not shown) of the modular device 160. The modular device 160 includes four sets of connectors 164 coupled near opposite ends of the faceplate 162. The modular device 160 further includes two additional sets of connectors 166, coupled to the faceplate 162, into which external cables may be coupled. The sets of connectors 144, 154, 164, and 166 may terminate circuitry internal to the modular devices 140, 150, and 160, respectively. In a particular example, the sets of connectors 144, 154, 164, and 166 terminate optical circuitry internal to the modular devices 140, 150, and 160, respectively.

The swing-arm assemblies 120 each include a plenum 120-1, two swing-arms 120-2, and a swing-arm 120-3. The plenums 120-1 may house infrastructure 120-6, such as optical cables. Each of the swing-arms 120-2 houses a set of connectors 120-4, and each of the swing-arms 120-3 houses a set of connectors 120-5. Each set of connectors 120-4 and 120-5 terminate the infrastructure 120-6 housed in the plenum 120-1. Moreover, as illustrated, the swing-arms 120-3 are twice as large as the swing-arms 120-2. The size difference is to accommodate the sets of connectors 120-5 having twice as many optical connection positions as the sets of connectors 120-4 to, for instance, allow additional optical connections for the modular device 160. An optical connection position may be an optical lens. In another example, all the swing-arms may have the same size and accommodate the same number of optical connection positions.

The plenums 120-1 may be fastened to the sides 136 of the enclosure 130. The swing-arms 120-2 and 120-3 are slideably and rotatably coupled to the plenums 120-1. For example, this allows the swing-arms 120-2 and 120-3 to be linearly translated relative to the plenum 120-1 and rotated by up to 90 degrees relative to the plenum 120-1. Consequently, the swing-arms 120-2 and 120-3 may be individually arranged into three different positions relative to the sets of connectors 144, 154, and 164. The three positions are closed and mated, closed and unmated, and open, respectively.

In the closed and mated position, the connectors within a swing-arm are mated with connectors coupled to a faceplate of a modular device. FIG. 2 depicts all the swing-arms 120-2 and 120-3 in the closed and mated position. As such, the set of connectors 120-4 within two of the swing-arms 120-2 are mated with the sets of connectors 144 coupled to the faceplate 142. The set of connectors 120-4 within the two other swing-arms 120-2 are mated with the sets of connectors 154 coupled to the faceplate 152. The set of connectors 120-5 within the swing-arms 120-3 are mated with the sets of connectors 164 coupled to the faceplate 162.

The swing-arm may be transitioned from the closed and mated position to the closed and unmated position. In the closed and unmated position, the connectors in the swing-arm are parallel to but disengaged from the connectors coupled to the faceplate. FIG. 4 depicts a top view of one of swing-arms 120-2 in the closed and unmated position. As shown, when the swing-arms 120-2 are pulled out towards the direction away from the faceplate 142, the connectors 120-4 in the swing-arm 120-2 are parallel to but disengaged from the connectors 144 coupled to the faceplate 142.

The swing-arm may be transitioned from the closed and unmated position to the open position by rotating the swing-arms 120-2, 120-3 away from the faceplate 142 and about a swing-arm pivot 120-7. In the open position, the connectors in the swing-arm are orthogonal to and disengaged from the connectors coupled to the faceplate. FIG. 3 depicts all the swing-arms 120-2 and 120-3 in the open position. With the swing-arms 120-2 and 120-3 in the open position, any of the modular devices 140, 150, and/or 160 may be removed, for instance for servicing or replacing.

In accordance with one or more examples of the present disclosure, one or more lock mechanisms may be included as part of the electronic device 100 to lock at least a portion of faceplane infrastructure also included therein. For example, one or more lock mechanisms may be used to lock respective sets of mated connectors when swing-arms 120-2 and 120-3 are in the closed and mated position. Each lock mechanism includes elements that are coupled to a swing-arm assembly and elements that are coupled to and/or within a modular device, for instance coupled to the faceplate of the modular device.

Various aspects of a lock mechanism in accordance with one or more examples of the present disclosure are depicted in and will next be described by reference to FIGS. 2-21. In some of the illustrated examples, the lock mechanism includes a locking bar, a locking bar engagement element, and a securing device. The locking bar and securing device may be coupled to a faceplate of a modular device. The locking bar engagement element may be fixedly coupled to the swing-arm of a swing-arm assembly. The securing device may lock and unlock the swing-arm when the locking bar engagement element is removably engaged with the locking bar through an aperture in the faceplate. Consequently, the securing device may lock the swing-arm to the faceplate to, thereby, transition the lock mechanism to a locked state. Conversely, the securing device may unlock the swing-arm from the faceplate to, thereby, transition the lock mechanism to an unlocked state.

In some of the illustrated examples, the lock mechanism includes a securing device controller that may activate the securing device to lock the portion of the faceplane infrastructure or deactivate the securing device to unlock the portion of the faceplane infrastructure. In one illustrated example, the securing device controller is an electronic controller. In another illustrated example, the securing device controller is a magnetic controller. In yet another illustrated example, the securing device controller is an electromagnetic controller.

In some of the illustrated examples, the lock mechanism includes an access control system to control access to deactivate the securing device. The access control system may allow manually controlled access, sensor controlled access, tag controlled access, and/or remote-signal controlled access to deactivate the securing device.

In some of the illustrated examples, the lock mechanism includes a cable lock device. The cable lock device may lock a cable assembly of the faceplane infrastructure. The cable lock device may be coupled to the faceplate of a modular device.

Referring again to the drawings, FIGS. 2-5 illustrate some elements of lock mechanisms that may lock the swing-arms 120-2 and 120-3 of the swing-arm assemblies 120. The elements of the lock mechanism include locking bars 500, handle wheels 172, and locking bar engagement elements 174 (some of which are labeled for clarity). The handle wheels 172 form a lock control component that may be used to control the locking bars 500 as described further below.

Details of the elements of the lock mechanism coupled to the modular device 140 are next described. Although not described herein in the same amount of detail for the sake of brevity, the modular devices 150 and 160 may be equipped with similar lock mechanisms that operate similarly. As illustrated by the dashed lines, the locking bars 500 are coupled (as described further below) behind the faceplate 142 and interior to the modular device 140, to prevent unauthorized access to the locking bars 500. The handle wheel 172 is coupled to a front surface of the faceplate 142 and also coupled through the faceplate 142 to the locking bars 500 to control movement of the locking bars 500.

The locking bar engagement elements 174 are coupled to the swing-arms 120-2 (and similarly to the swing-arms 120-3 for the modular device 160). More particularly, one of the locking bar engagement elements 174 is fixedly coupled to a top edge of the swing-arm 120-2 that is mounted near the left edge of the faceplate 142. The other locking bar engagement element 174 is fixedly coupled to a bottom edge of the swing-arm 120-2 that is mounted near the right edge of the faceplate 142. In the specific example illustrated, the locking bar engagement elements 174 are formed into and extend from the swing-arms 120-2. This assists in preventing disassembly of the lock mechanism while in the locked state. However, in other examples, the locking bar engagement elements 174 may be permanently attached to the swing-arms 120-2 using any suitable attachment mechanism including one or more fasteners and/or an adhesive.

When the swing-arms 120-2 are in the closed and mated position, the locking bar engagement elements 174 extend through openings 146 (also referred to as apertures) in the faceplate 142. The handle wheel 172 may be rotated clockwise (as illustrated by an arrow pointing clockwise in FIG. 5) to move ends 502 of the locking bars 500 into contact with the locking bar engagement elements 174. As it will be described later in detail, the rotation of the handle wheel 172 may be manually operated or remotely controlled before a swing-arm 120-2, 120-3 is closed. In another example, the rotation of the handle wheel 172 may be automatic by designing the shape of ends 502 of the locking-bar 500 to have a beveled end so that the locking bar 500 is pushed toward the handle wheel 172 while the locking bar engagement element 174 is inserted through the opening 146 in the faceplate 142. The locking-bar 500 may be spring loaded so that it returns to a resting position after the locking bar engagement element 174 is fully inserted, where the locking bar engagement element 174 retains the locking-bar 500.

A securing device (not shown in FIGS. 2-5) may be electronically, magnetically, or electromagnetically activated by a securing device controller (also not shown in FIGS. 2-5) to secure or lock the swing-arms 120-2 to the faceplate 142. In another example, a control button 180 may be used to manually activate the securing device. An indicator 182 may visually indicate that the lock mechanism is in the locked state. The indicator 182 may be used, for instance, to notify a system administrator of the swing-arms 120-2 being disconnected, allowing additional security and operational procedure logs.

When the lock mechanism is assembled and in the locked state, an access control system of the lock mechanism may be used to control access to deactivate the securing device. An example access control system may include a sensor 176, a sensor 178, and/or a keyhole 184. The sensors 176 and 178 may include a fingerprint sensor, a tag reader, a camera, and/or a wireless interface. As such, the sensors 176 and 178 may allow fingerprint, tag identifier, facial recognition, and/or wireless signal authentication to deactivate the securing device, in order to transition the lock mechanism to the unlocked state.

In other examples, a manual access mechanism may be used to deactivate the securing device. For example, a key (not shown) may be inserted into the keyhole 184 to allow deactivation of the securing device. In another example, a combination may be entered into a keypad (not shown) to allow deactivation of the securing device. In yet another example, a remote wireless signal may be used to deactivate the securing device or to enable the control button 180 to use in deactivating the securing device. Once the lock mechanism is in the unlocked state, the handle wheel 172 may be rotated counterclockwise (as illustrated by arrows pointing counterclockwise in FIG. 5) to move ends 502 of the locking bars 500 out of contact with the locking bar engagement elements 174.

Figure 6:
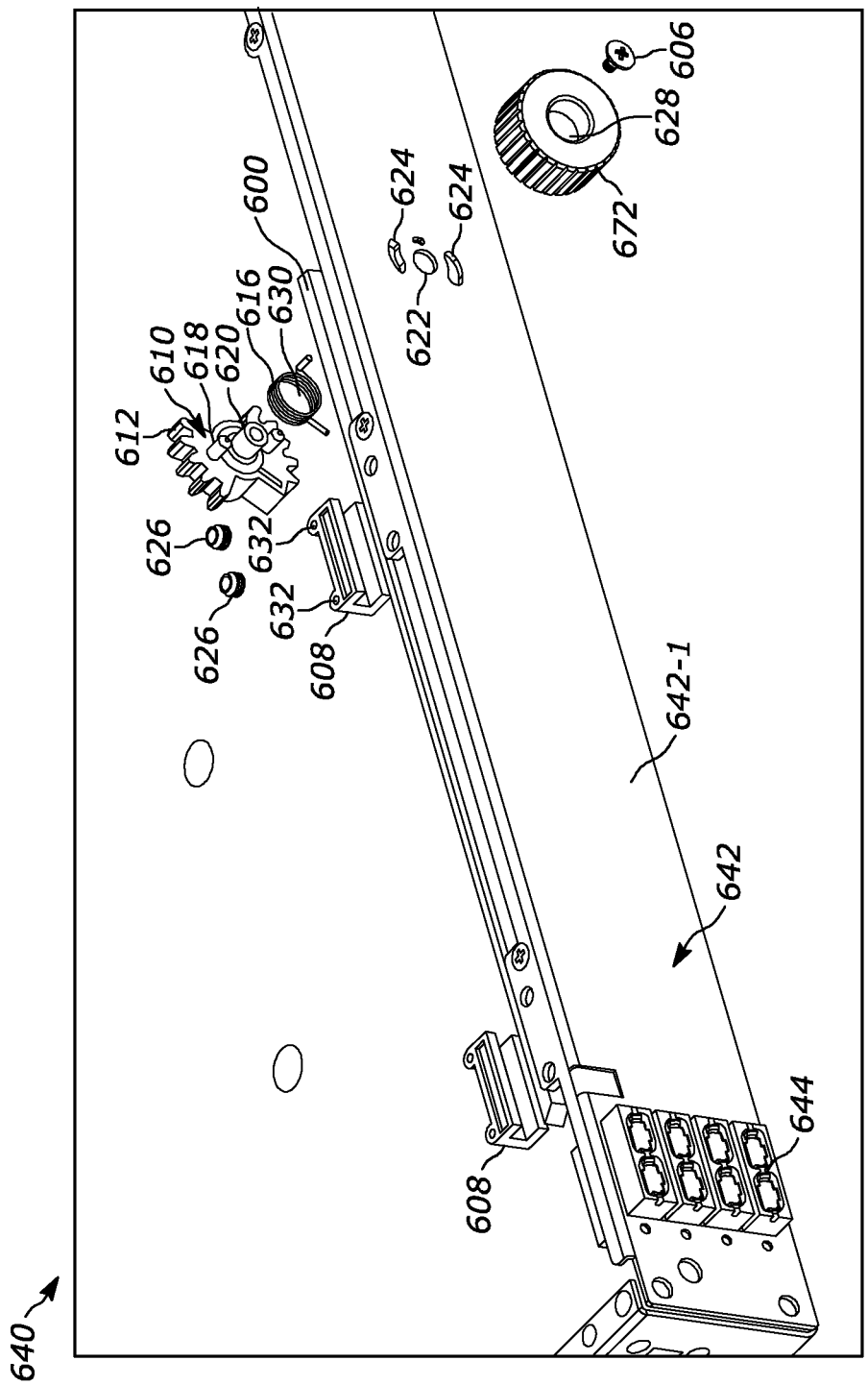
FIGS. 6-8 depict locking bars and control components for the locking bars of a lock mechanism for faceplane infrastructure, according to one or more examples of the present disclosure.
Figure 7:
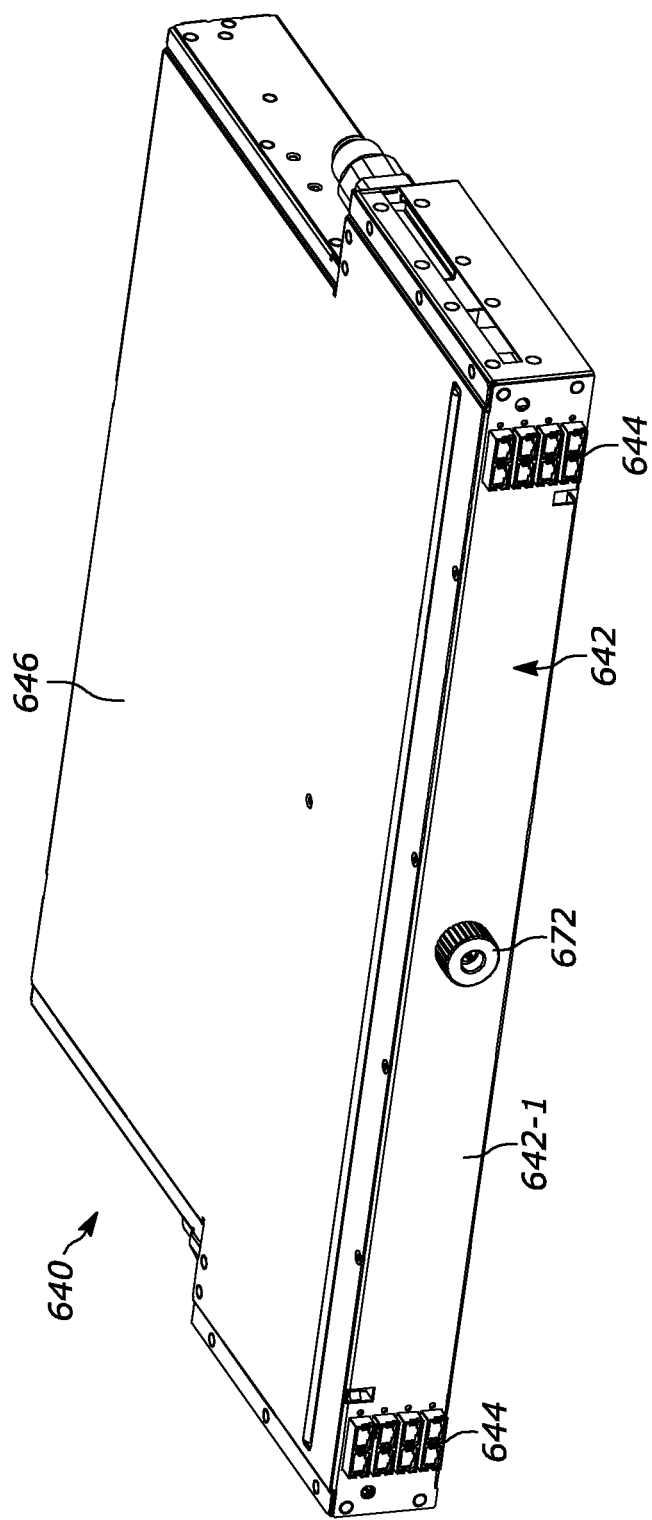
Figure 8:
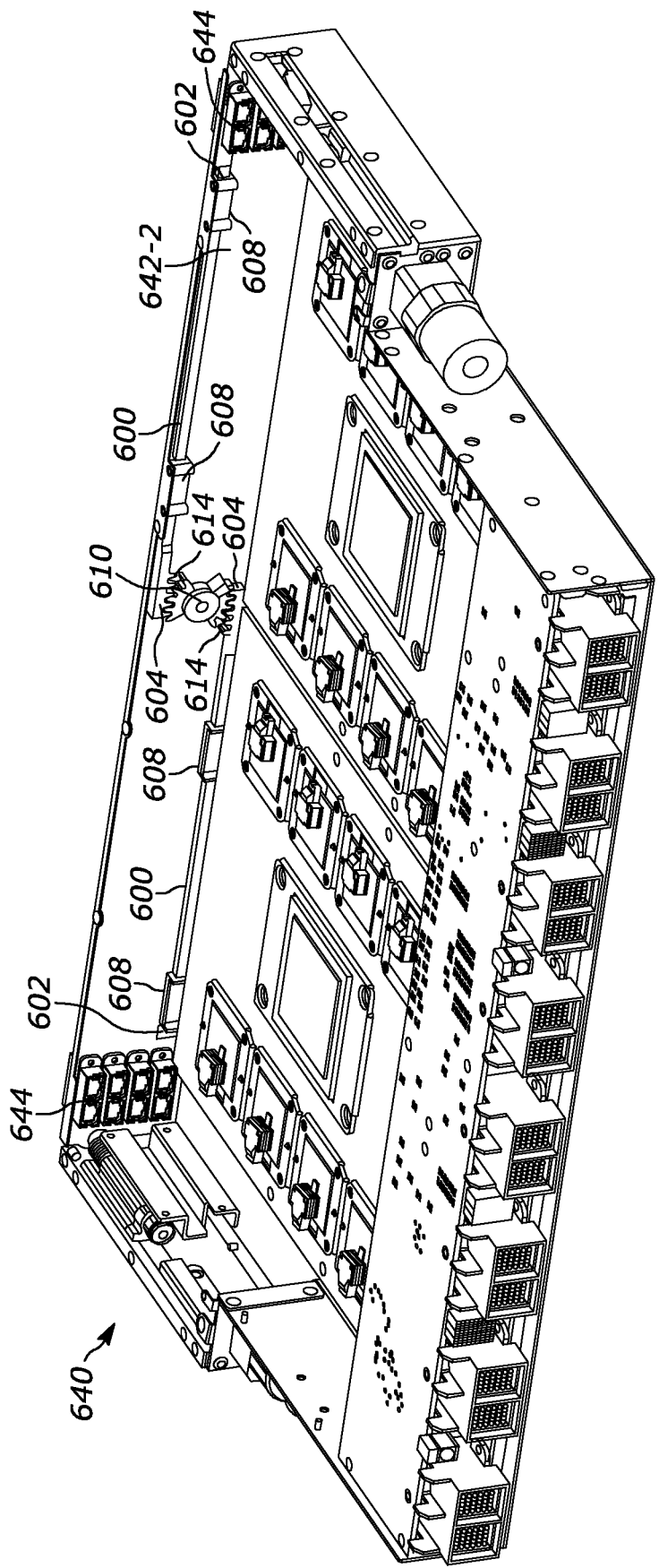

FIGS. 6-8 depict locking bars 600 and other elements of a lock mechanism coupled to a modular device 640. In particular, FIG. 6 is an exploded view of control components (for example, bar guides 608, a handle wheel gear 610, and a handle wheel 672) of the lock mechanism. FIG. 7 depicts a first of the control components (e.g., handle wheel 672) coupled to an external surface 642-1 of a faceplate 642 of the modular device 640. FIG. 8 depicts the locking bars 600 and a second of the control components (e.g., handle wheel gear 610) coupled to an internal surface 642-2 of the faceplate 642 of the modular device 640. A panel 646 of the modular device 640 is removed in FIG. 8 to depict an internal view of the modular device 640.

As illustrated in FIG. 6, to couple the handle wheel 672 and the handle wheel gear 610 to the faceplate 642, a handle wheel retention screw 606 is inserted through an opening 628 of the handle wheel 672, an opening 622 of the faceplate 642, and an opening 630 of a circular bias spring 616 into a screw hole 620 of the handle wheel gear 610. Protrusions 618 from the handle wheel gear 610 extend through openings 624 of the faceplate 642 into holes (not shown) in the backside of the handle wheel 672. The handle wheel retention screw 606 secures the handle wheel 672 to the external surface 642-1 of the faceplate 642 (as shown in FIG. 7). The handle wheel retention screw 606 further secures the handle wheel gear 610 to the internal surface 642-2 of the faceplate 642 (as shown in FIG. 8). Two bar guides 608 are used to mount each of the two locking bars 600 to the internal surface 642-2 of the faceplate 642. Screws 626 may be inserted into holes 632 to secure each bar guide 608 to the faceplate 642.

As illustrated in FIG. 8, when the handle wheel 672, handle wheel gear 610, and bar guides 608 are mounted, teeth 614 on an end 604 of each locking bar 600 engage with teeth 612 on the handle wheel gear 610. The bias spring 616 allows the handle wheel 672 to function as a momentary switch and exerts a force that biases the locking bars 600 away from the center of the modular device 640 and into locking bar engagement elements (not shown) of closed and mated swing-arms (not shown). Rotating the handle wheel 672 in a first direction (e.g., clockwise) linearly translates the locking bars 600 relative to the bar guides 608 coupled to the interior surface 642-2 of the faceplate 642. This linear translation allows a beveled end 602 of each locking bar 600 to disengage with a respective locking bar engagement element (not shown) coupled to faceplane infrastructure (not shown) that may be coupled externally from the modular device 640. Releasing the handle wheel 672 allows the bias spring 616 to exert a force on the locking bars 600, causing a linear translation that allows the beveled end 602 of each locking bar 600 to engage with a respective lock bar engagement element (not shown).

In an example, the handle wheel 672 includes internal electronics that allows the handle wheel 672 to be locked into place to secure the locking bars 600 to the locking bar engagement elements (not shown). In a particular example, a system board (not labeled) within the modular device 640 may detect a state of one or more elements and send a wireless signal to lock the handle wheel 672. For instance, the system board may detect the engagement of the locking bar 600 with the locking bar engagement element (not shown) and/or the mating of connectors 644 on the faceplate 642 with connectors of a swing-arm (not shown) and/or the handle wheel 672 in the clockwise position, etc. In an alternative example, a separate securing device (not shown) may be used to physically secure the locking bars 600 to the locking bar engagement elements (not shown).

When the locking bars 600 are no longer secured to the locking bar engagement elements (not shown), rotating the handle wheel 672 in a second direction (e.g., counterclockwise) linearly translates the locking bars 600 in the opposite direction relative to the bar guides 608. This linear translation allows the beveled end 602 of each locking bar 600 to disengage with the respective locking bar engagement element (not shown) coupled to the faceplane infrastructure (not shown).

Figure 9:
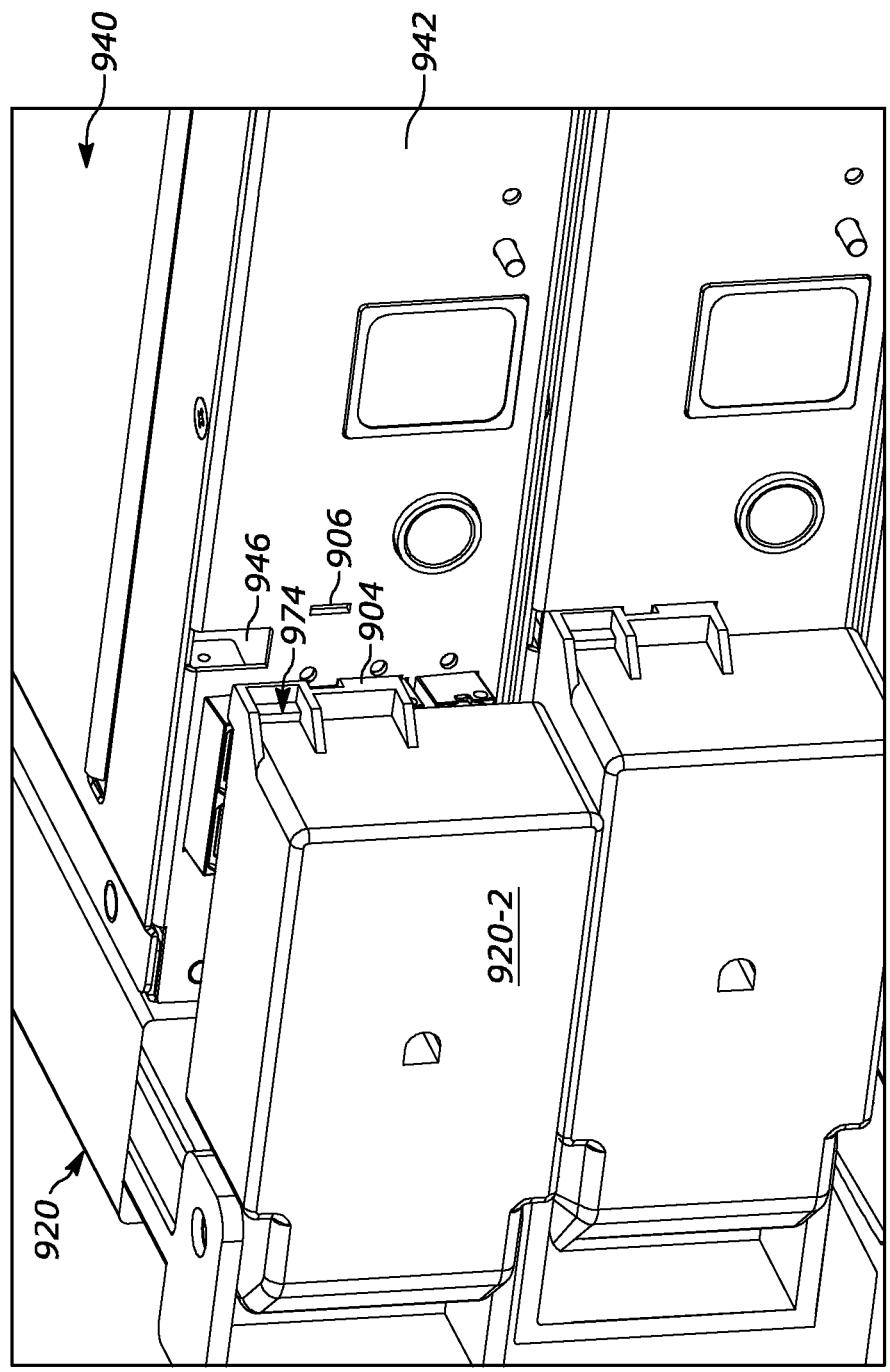
FIGS. 9-10 depict a locking bar engaging with a locking bar engagement element of a lock mechanism for faceplane infrastructure, according to one or more examples of the present disclosure.
Figure 10:
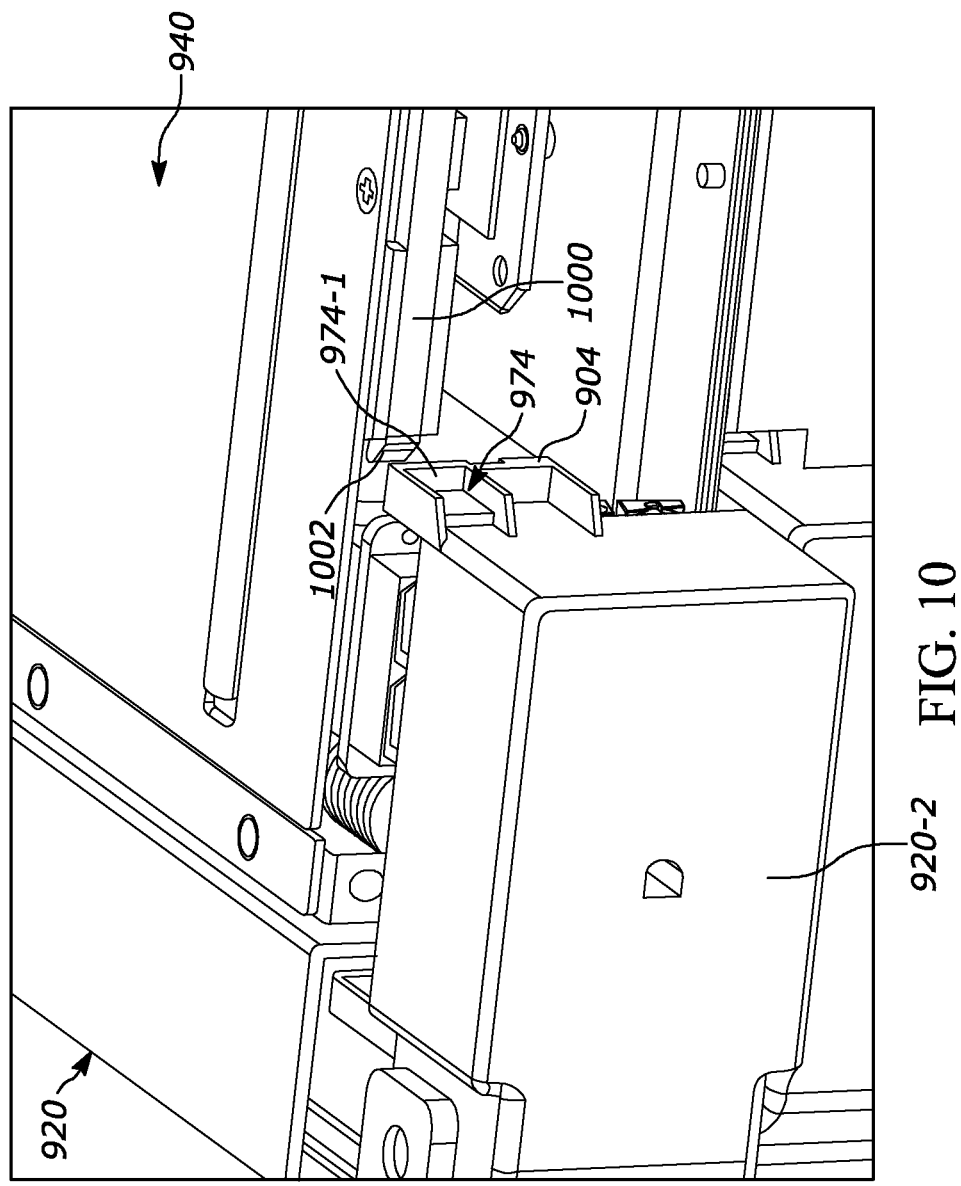

FIGS. 9-10 depict enlarged partial perspective views that show a locking bar 1000 engaging with a locking bar engagement element 974 of a lock mechanism coupled to a modular device 940 and a swing-arm assembly 920. The modular device 940 is depicted with a faceplate 942 in FIG. 9 and without the faceplate 942 in FIG. 10, in order to see the locking bar 1000 that is internal to the modular device 940.

In the illustrated example, the locking bar engagement element 974 extends from an edge of a swing-arm 920-2 of a swing-arm assembly 920. The locking bar engagement element 974 may have any suitable shape, such as a three-sided pocket or a slotted tab, to serve as a receptacle for a beveled end 1002 of the locking bar 1000. When the swing-arm 920-2 is being transitioned to the closed and mated position, the locking bar engagement element 974 extends through an opening 946 in the faceplate 942. A beveled side of the beveled end 1002, which is adjacent to the faceplate 974, may serve as an engagement lead-in for the locking bar engagement element 974. When the swing-arm 920-2 is in the closed and mated position, a flat side of the beveled end 1002, which faces away from the faceplate 974, engages with a surface 974-1 of the locking bar engagement element 974. The locking bar 1000 may be biased such that the beveled end 1002 exerts a positive mating force on the swing-arm 920-2 to maintain the swing-arm 920-2 in the closed and mated position. Accordingly, when the locking bar 1000 is locked into place (for instance using a securing device as described later), the swing-arm 920-2 is locked, thereby, being prevented from being disengaged and opened.

As further illustrated, a tab 904 extending from the swing-arm 920-2 may be inserted through an opening 906 in the faceplate 942, when the swing-arm 920-2 is being transitioned to the closed and mated position. In an example, the tab 904 may engage with an element of an electronic control device (not shown) to allow the electronic control device to detect that the swing-arm 920-2 is in the closed and mated position. In one example, the electronic control device may, thereby, notify a system controller (not shown) that may manage connector statuses for the modular device 940.

Figure 11:
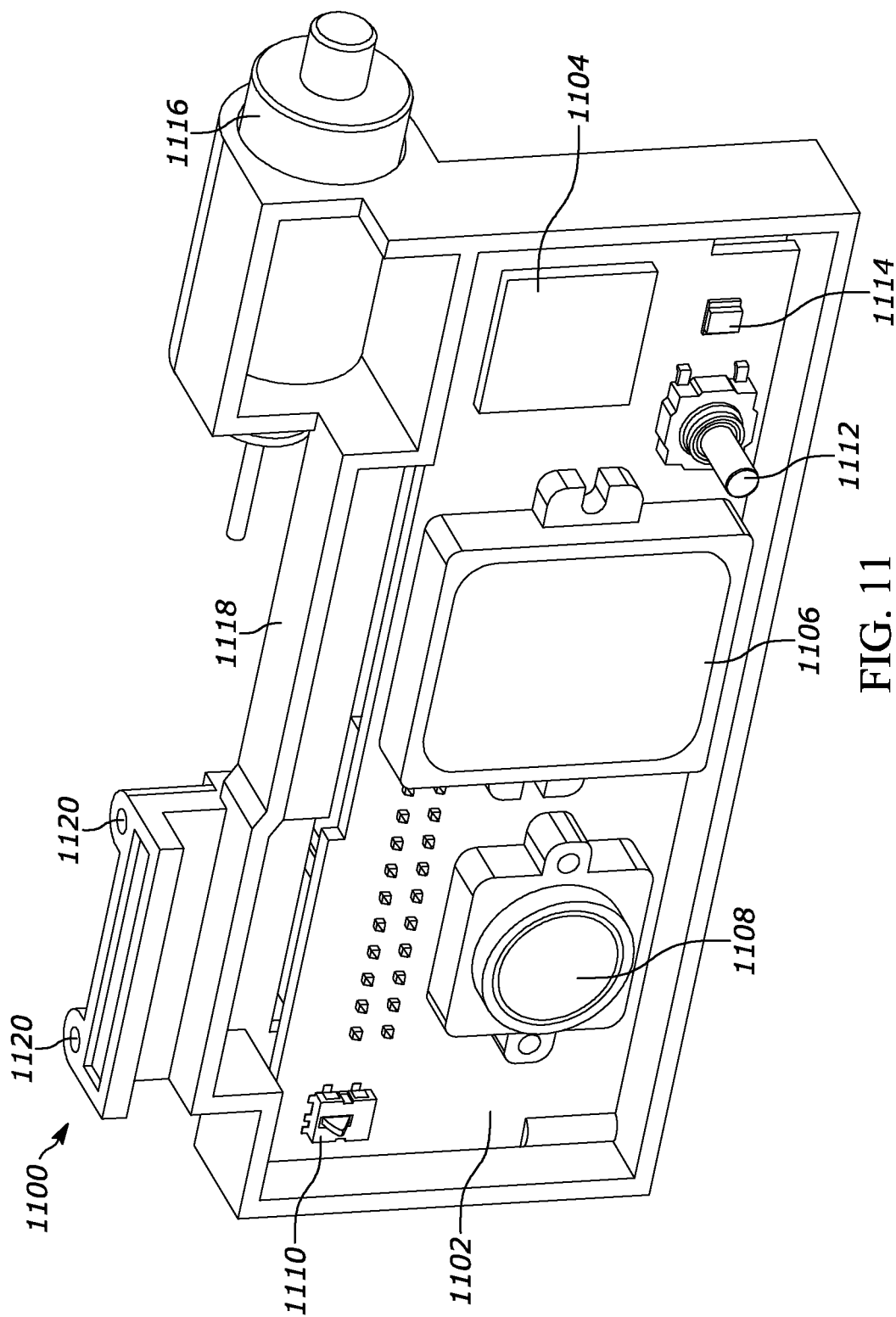
FIGS. 11-14 depict an electronic control device of a lock mechanism for faceplane infrastructure, according to one or more examples of the present disclosure.

FIGS. 11-14 depict an electronic control device of a lock mechanism for faceplane infrastructure (not shown), according to one or more examples of the present disclosure. FIG. 11 depicts the example electronic control device 1100. The electronic control device 1100 includes a housing 1118 that houses a circuit board 1102 and an electronically controlled securing device ("securing device") 1116. Elements mounted on the circuit board 1102 may serve as an electronic controller for operating the securing device 1116.

As further illustrated in FIG. 11, a controller chip 1104, sensors 1106-1110, a control button 1112, and an indicator 1114 may be mounted to the circuit board 1102 of the electronic control device 1100. The controller chip 1104 may manage the operation of the securing device 1116, the sensors 1106-1110, the control button 1112, and the indicator 1114. For example, the sensors 1106 and 1108 may be used to implement an access control system to determine access privilege to allow the controller chip 1104 to control the securing device 1116 to, for instance, deactivate the securing device 1116. The controller chip 1104 may include any suitable circuitry to perform its control functions including, but not limited to, one or more processors, one or more memory resources, one or more non-transitory computer readable storage mediums, etc.

In an example, the sensor 1108 may include a camera that may be used for facial recognition to allow the controller chip 1104 to authenticate an operator. In another example, the sensor 1106 may operate as a fingerprint sensor to allow the controller chip 1104 to authenticate an operator. In another example, the sensor 1106 may operate as a tag reader to allow the controller chip 1104 to authenticate an operator. In yet another example, the controller chip 1104 may include a wireless interface to receive a control signal from a remote device, such as a mobile device or a tablet, to allow the controller chip 1104 to authenticate an operator. In some other examples, the controller chip 1104 may communicate with a data center system management controller over a network interface (not shown) to get computational and/or database assistance in authenticating an operator. Upon authenticating the operator, the controller chip 1104 may deactivate the securing device 1116. Alternatively, a remote signal may be used to enable the control button 1112 for manual use by an unauthenticated operator to deactivate the securing device 1116, by pressing the control button 1112.

Figure 12:
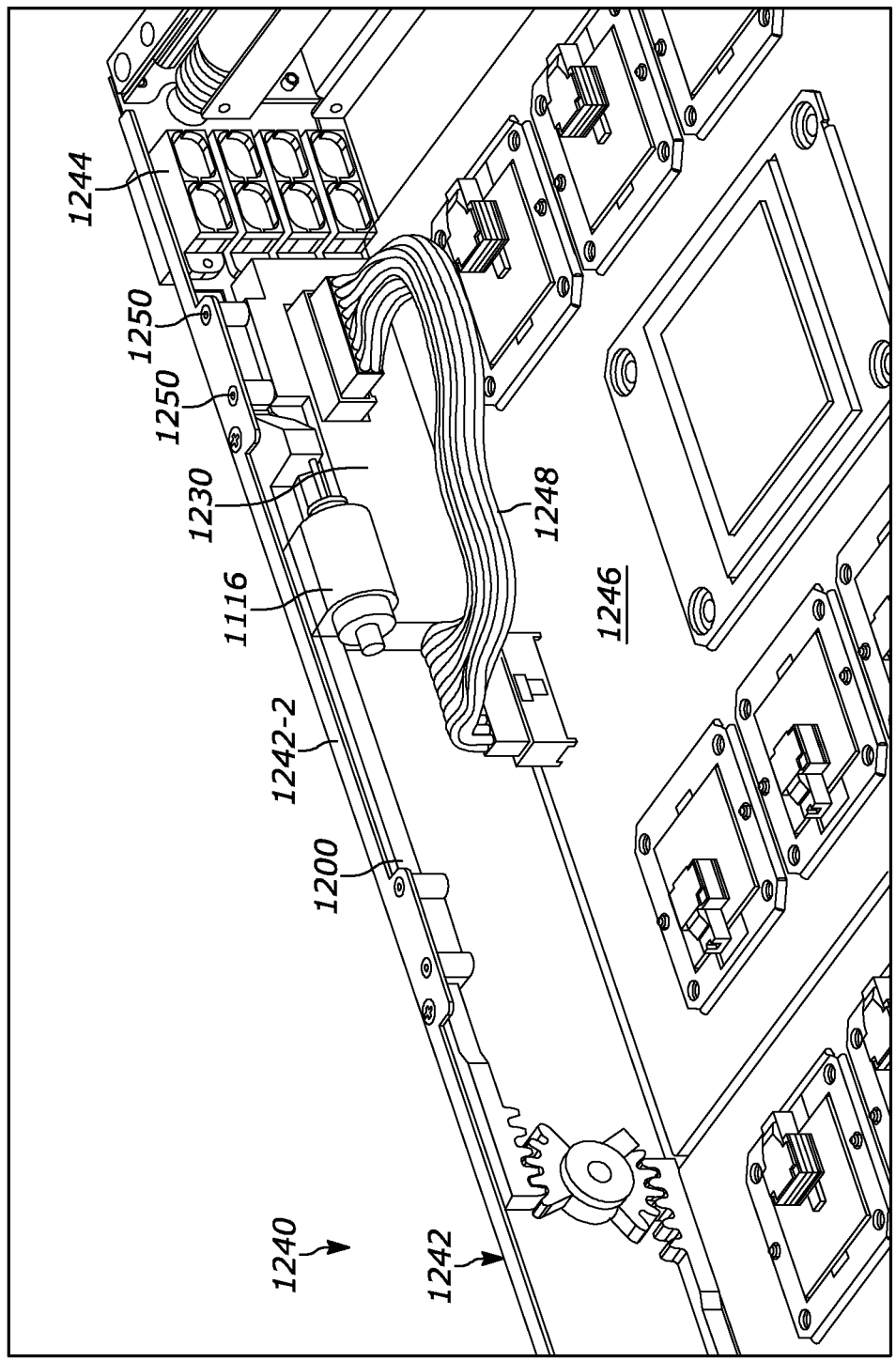

FIG. 12 depicts the electronic control device 1100 mounted to a modular device 1240, wherein a backside 1230 of the electronic control device 1100 faces internally to the modular device 1240. Particularly, screws 1250 may be inserted into openings 1120 of the housing 1118 to mount the electronic control device 1100 to a top edge 1242-2 of a faceplate 1242 of the modular device 1240. In an example, when mounted, the sensors 1106-1110, control button 1112, and indicator 1114 may be accessible through openings in the faceplate 1242. In addition, a connector cable 1248 may be coupled between the backside 1230 of the electronic control device 1100 and a system board 1246 of the modular device 1240. The connector cable 1248 may be used to communicatively couple one or more of the elements of the electronic control device 1100 to the system board 1246 of the modular device 1240. In an example, when connectors of swing-arm (not shown) are mated with internal optical connectors (not shown) installed in connector housing 1244 mounted on the faceplate 1242, a protrusion from the swing-arm may depress the sensor 1110. Responsively, the controller chip 1104 may send a signal to the system board 1246 to allow the system board to manage the status of the optical connectors in the connector housing 1244, e.g., as being connected or unconnected.

Figure 13:
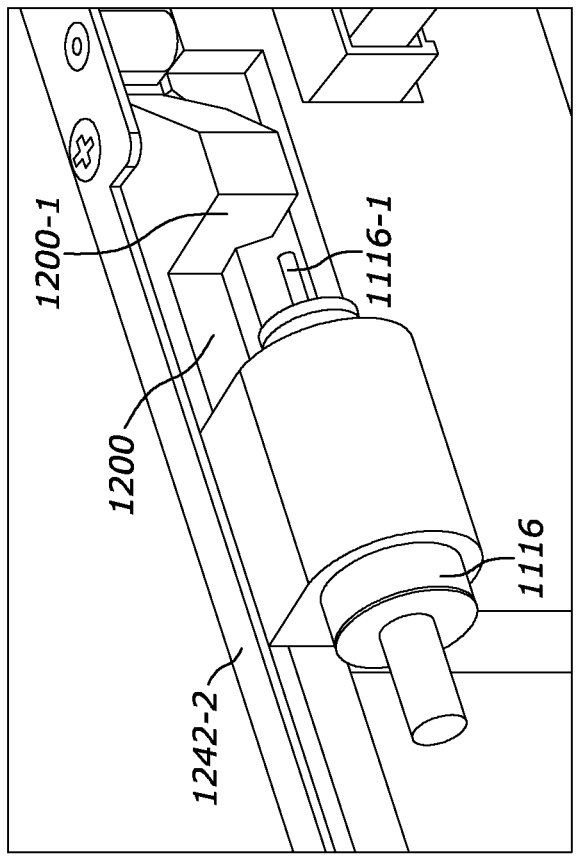

When the electronic control device 1100 is installed, depression of the control button 1112 or authentication through the sensors 1106 or 1108 or using a wireless signal may allow the controller chip 1104 to operate circuitry and/or hardware, such as relays (not shown), within the electronic control device 1100 to allow linear movement of the securing device 1116. FIG. 13 illustrates the securing device 1116 in a disengaged state. In the disengaged state, a pin 1116-1 extending from the securing device 1116 is disengaged from a surface 1200-1 of a locking bar 1200. As such, the locking bar 1200 may be disengaged from a locking bar engagement element (not shown) coupled to faceplane infrastructure (not shown), for instance as illustrated by reference to FIGS. 9 and 10. When the securing device 1116 is in the disengaged state, the controller chip 1104 may deactivate indicator 1114. In an example, the securing device 1116 may be a solenoid.

Figure 14:
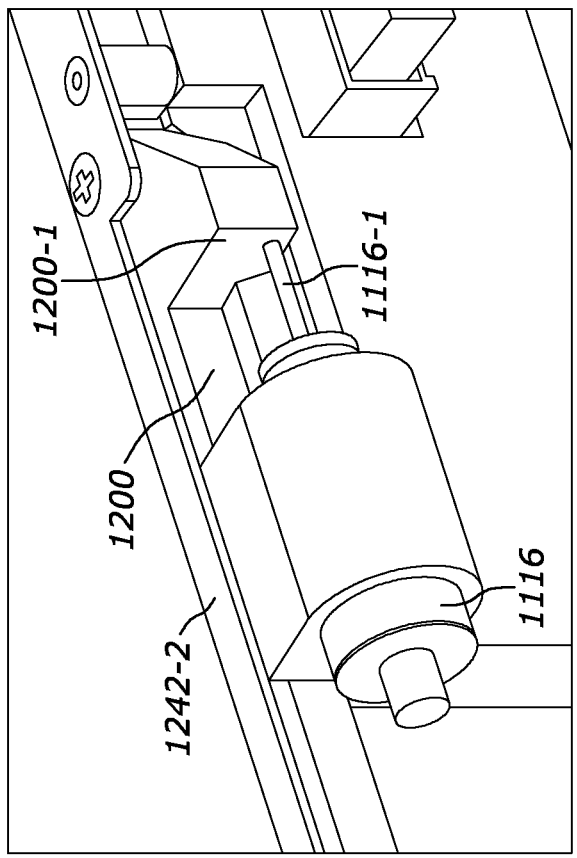

Conversely, FIG. 14 illustrates the securing device 1116 in an engaged state. In the engaged state, the pin 1116-1 is engaged with the surface 1200-1 of the locking bar 1200. As such, securing device 1116 may mechanically lock a locking bar engagement element (not shown) when it is engaged with the locking bar 1200. When the securing device 1116 is in the engaged state, the controller chip 1104 may activate the indicator 1114.

Figure 15:
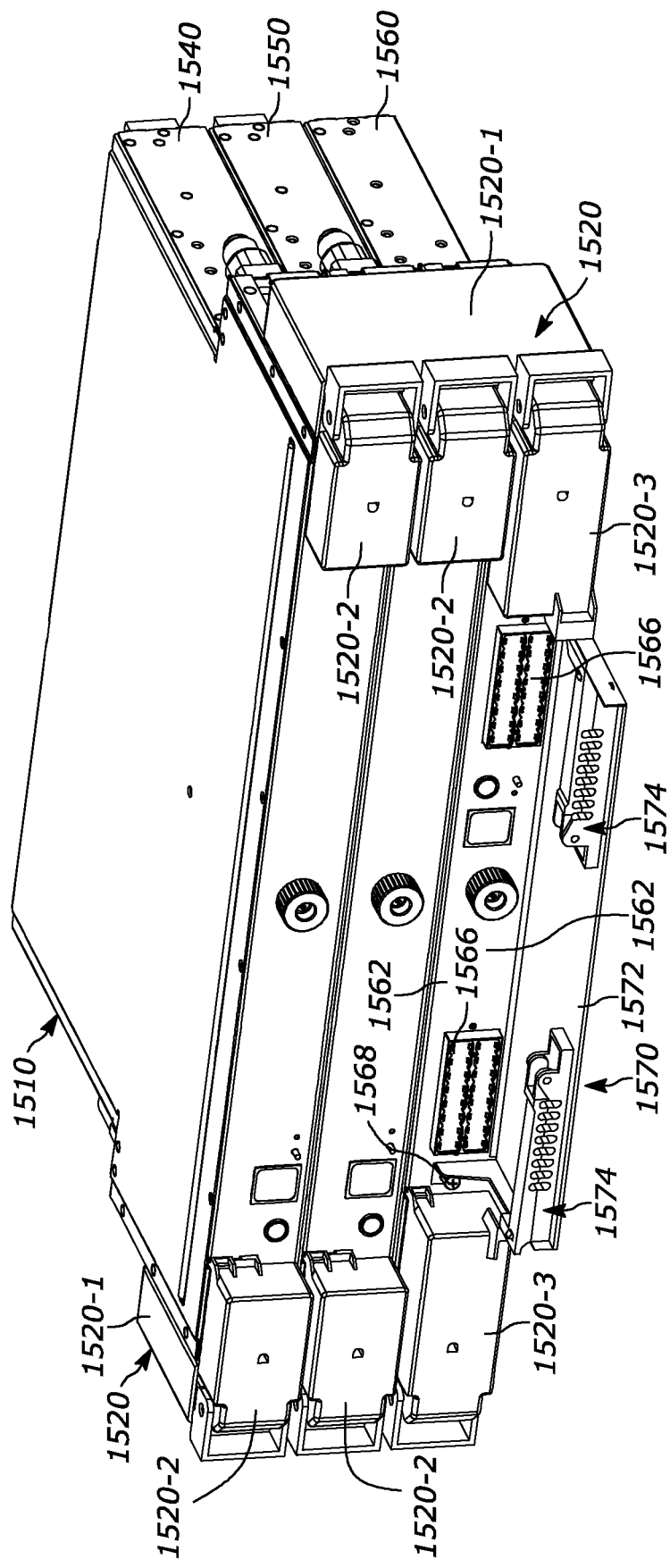
FIGS. 15-17 depict a cable lock device of a lock mechanism for faceplane infrastructure, according to one or more examples of the present disclosure.
Figure 16:
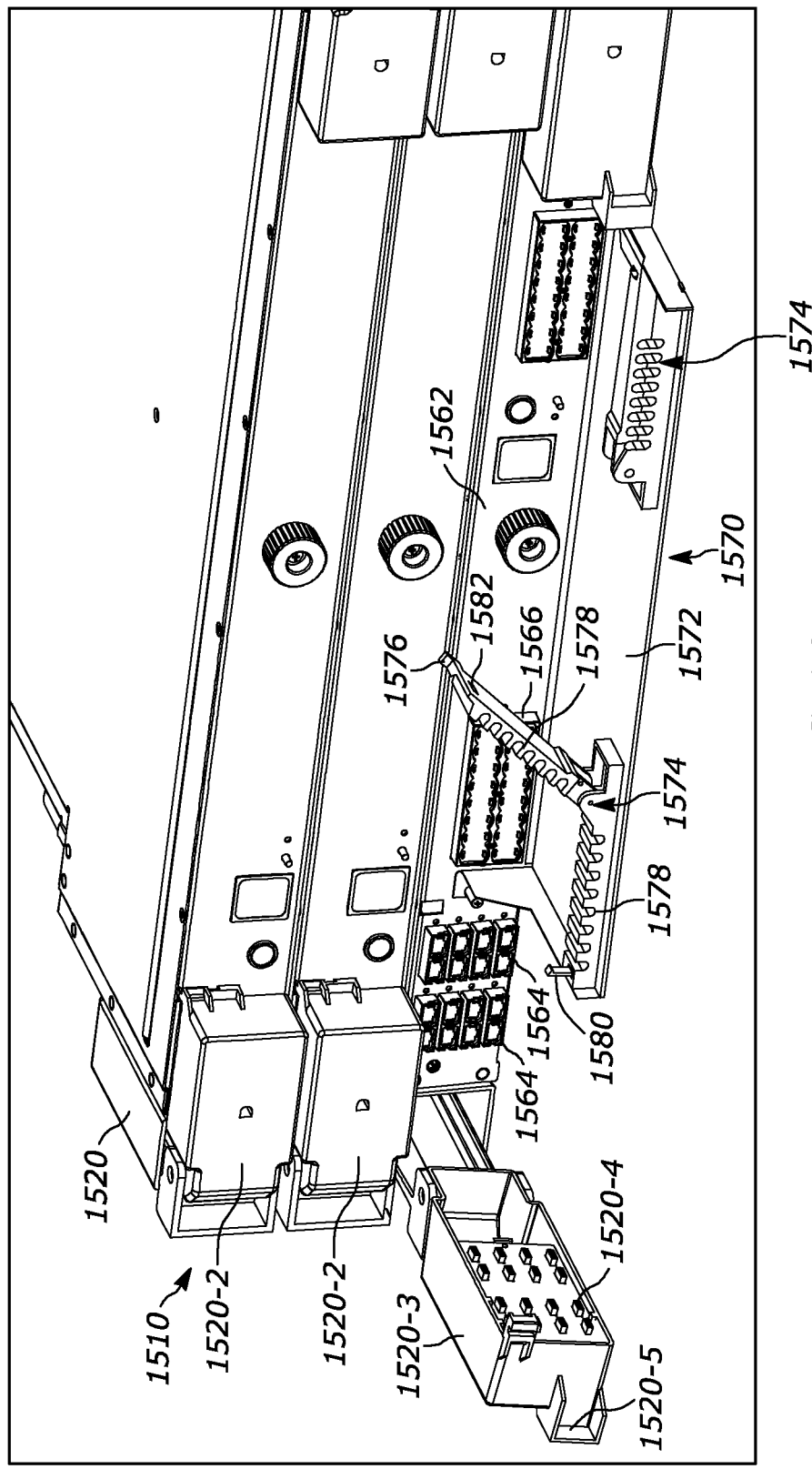
Figure 17:
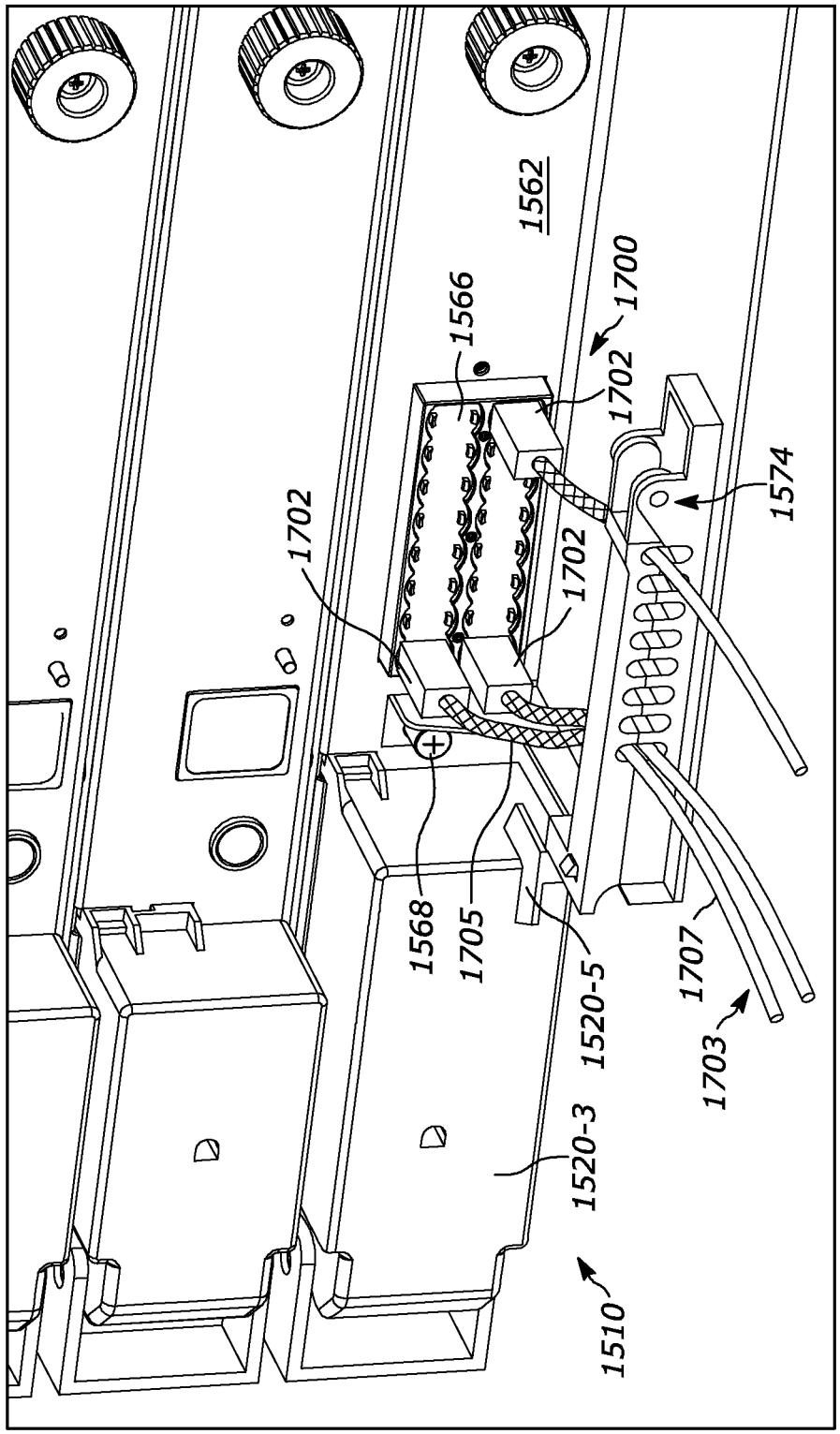

FIGS. 15-17 depict a cable lock device of a lock mechanism for faceplane infrastructure that includes two swing-arm assemblies 1520, according to one or more examples of the present disclosure. FIG. 15 depicts a modular device assembly 1510 and two swing-arm assemblies 1520. The modular device assembly 1510 includes modular devices 1540, 1550, and 1560. In an example, the modular devices 1540 and 1550 are switch trays, and the modular device 1560 is a fiber shuffle tray. The swing-arm assemblies 1520 each include a plenum 1520-1 and swing-arms 1520-2 and 1520-3 slideably and rotatably coupled to the plenum 1520-1. Also depicted is a cable lock device 1570 that includes an clamp tray 1572 and two cable routing clamps ("clamps") 1574 mounted to the clamp tray 1572. The clamp tray is modularly and semi-permanently attached to a faceplate 1562 of the modular device 1560, using any suitable securing mechanism such as screws 1568. The clamps 1574 may be permanently attached to the clamp tray 1572 using any securing mechanism, such as a suitable fastener.

FIG. 15 depicts all the swing-arms 1520-2 and 1520-3 in a closed and mated position. FIG. 16 depicts one of the swing-arms 1520-3 in an open position. As such, connectors 1564 coupled to the faceplate 1562 of the modular device 1560, connectors 1520-4 housed in the swing-arm 1520-3, and a clamp lock 1520-5 extending from the swing-arm 1520-3 are visible. As further illustrated in FIG. 16, a tip 1576, grooves 1578, a clamp retention latch 1580, and an opening 1582 are formed into each clamp 1574.

FIG. 17 depicts a mated cable assembly 1700, which may be implemented as a part of the faceplane infrastructure, and which may be secured using the cable lock device 1570. The mated cable assembly 1700 includes a plurality of plug connectors 1702 (three shown) of cable assemblies 1703 mated to corresponding receptacle connectors 1566 coupled to the faceplate 1562 of the modular device 1560. Each plug connector 1702 may have retention features to securely mate to a receptacle connector 1566.

To secure the cable assemblies 1703, the clamp 1574 is closed and latched by extending the clamp retention latch 1580 through the opening 1582 of the clamp 1574. When closed, the groves 1578 form openings for separating and sequencing cables 1707 of the cable assemblies 1703. When the swing-arm 1520-3 is placed in the closed and mated position, the clamp lock 1520-5 engages the tip 1576 of the clamp 1574 to prevent the clamp 1574 from being opened. Once the swing-arm 1530-3 is locked using a securing device (not shown), for example as earlier described, this also locks the clamp 1574. In the example shown, each cable assembly 1703 has a cable boot 1705 long enough to butt against the clamp 1574. The cable boot 1705 has a larger circumference than a circumference of the cable 1707 to further restrict removal of the corresponding plug connector 1702 from the receptacle connector 1566, when the clamp 1574 is locked onto the cable 1707. In other examples, the cable assemblies 1703 do not have the cable boot 1705. In other examples, the clamp 1574 may have protrusion towards the faceplate 1562 (not shown) to limit movement of the cable boots 1705 in order to prevent removal of the plug connector 1702 from the receptacle connector 1566.

Figure 18:
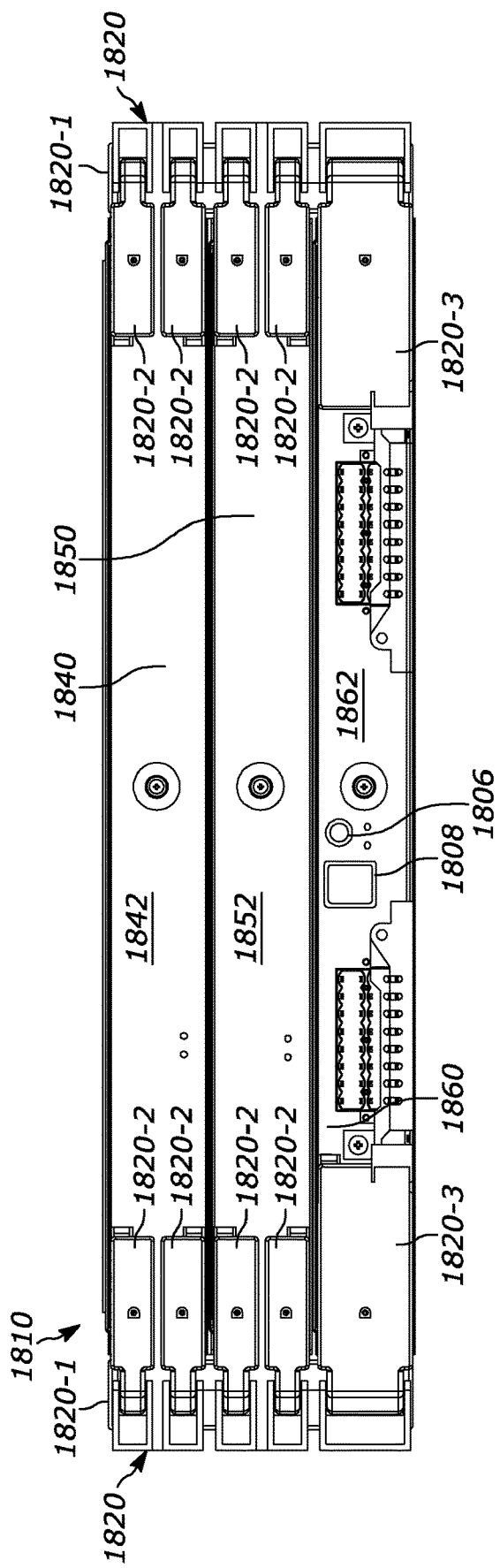
FIG. 18 is a front, plan view of a modular device assembly and swing-arm assemblies having a lock mechanism for faceplane infrastructure, according to one or more examples of the present disclosure.

FIGS. 18-21 depict drawings that illustrate example variations of a lock mechanism for faceplane infrastructure. Particularly, FIG. 18 depicts a front view of a modular device assembly 1810 and two swing-arm assemblies 1820 that may have coupled thereto a lock mechanism for faceplane infrastructure, according to one or more examples of the present disclosure. The modular device assembly 1810 includes modular devices 1840, 1850, and 1860. The swing-arm assemblies 1820 each include a plenum 1820-1 and swing-arms 1820-2 and 1820-3 rotatably coupled to the plenum 1820-1.

In this example variation, there are eight swing-arms 1820-2 in the swing-arm assembly 1820. Accordingly, connectors (not shown) in four swing-arms 1820-2 may mate with connectors (not shown) coupled to each of the respective faceplates 1842 and 1852 of the modular devices 1840 and 1850. As such, a lock mechanism implemented by each of the modular devices 1840 and 1850 may utilize up to four locking bars (not shown) each secured by a locking bar engagement element that may extend from one of the swing-arms 1820-2. The extra locking bars may provide added security.

In another example variation, one of the modular devices 160 may include sensors 1806 and 1808 coupled through a faceplate 1862. This may be useful to allow the same operator to be authenticated to access all the modular devices 1840, 1850, and 1860 using a single authentication process. In such a case, multiple of the modular devices 1840, 1850, and 1860 may include locking bars, securing devices, and securing device controllers, but a single access control system may be used to determine access to operate all the securing device controllers. However, where an operator is authorized to operate less than all of the modular devices 1840, 1850, and 1860, multiple of the modular devices 1840, 1850, and 1860 may be equipped with sensors similar to the sensors 1806 and 1808 so that different access control systems may be used to determine access to operate different securing device controllers.

Figure 19:
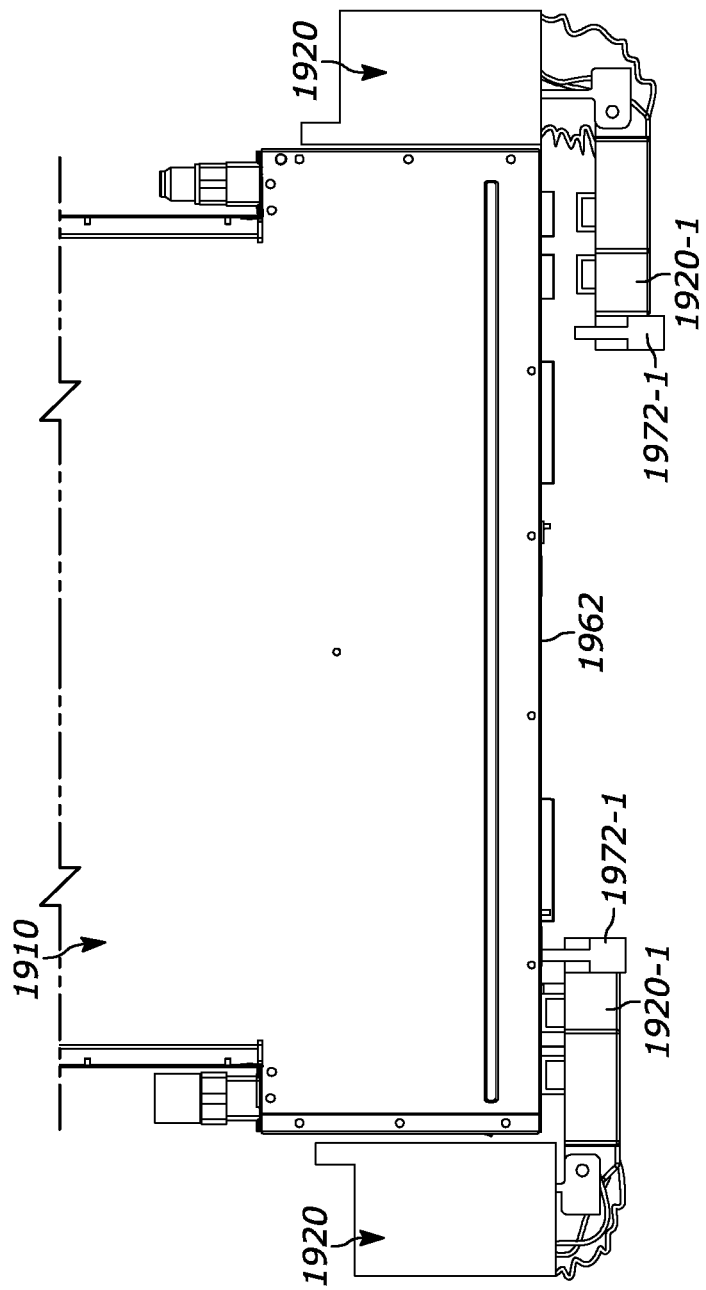
FIG. 19 is a partial top, plan view of a modular device assembly and swing-arm assemblies having a lock mechanism for faceplane infrastructure, according to one or more examples of the present disclosure.

FIG. 19 depicts a top view of a modular device assembly 1910 and two swing-arm assemblies 1920 that may have coupled thereto a lock mechanism for faceplane infrastructure, according to one or more examples of the present disclosure. In this example variation, two handle wheels 1972-1 and 1972-2 are included, instead of one. This may allow each locking bar (not shown) to be separately operated behind a faceplate 1962. As shown, the handle wheels 1972-1 and 1972-2 are coupled to swing-arms 1920-1 of the swing-arm assemblies 1920. However, in another example, the handle wheels 1972-1 and 1972-2 may be coupled to the faceplate 1962.

Figure 20:
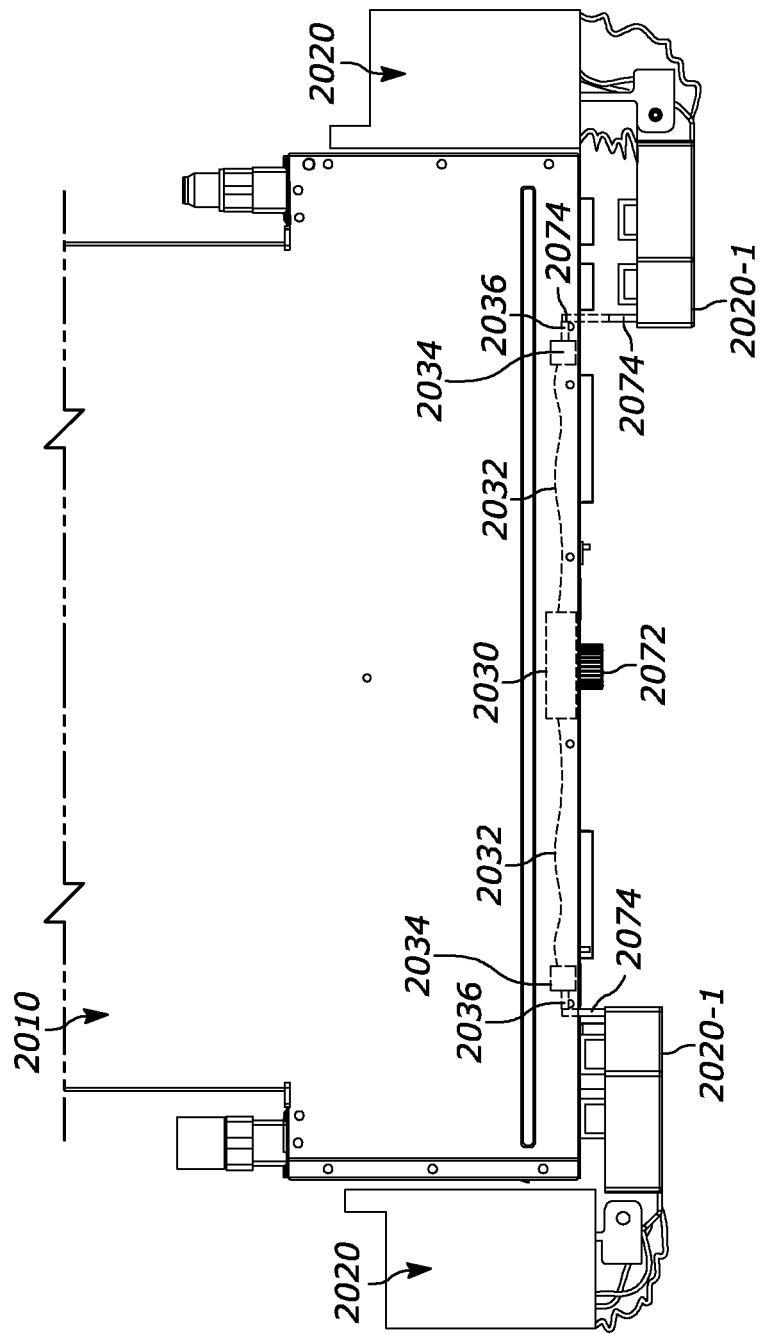
FIG. 20 is another partial top, plan view of a modular device assembly and swing-arm assemblies having a lock mechanism for faceplane infrastructure, according to one or more examples of the present disclosure.

FIG. 20 depicts a top view of a modular device assembly 2010 and two swing-arm assemblies 2020 having a lock mechanism for faceplane infrastructure, according to one or more examples of the present disclosure. This variation utilizes a magnetic securing device controller 2030. More particularly, the magnetic securing device controller 2030 may be coupled to magnetically controlled securing devices 2034 via wires 2032. The securing devices 2034 may be implemented as solenoids. The securing devices 2034 each have a locking bar 2036 attached thereto or extending therefrom. A handle wheel 2072 may be physically coupled to a faceplate and communicatively coupled to the magnetic securing device controller 2030.

When swing-arms 2020-1 are in the closed and mated position, the handle wheel 2072 may be rotated (e.g., clockwise) to actuate the magnetic securing device controller 2030 to magnetize the securing devices 2034, for instance by providing electrical current through the wires 2032. The magnetization may cause the securing devices 2034 to linearly translate away from the magnetic controller 2030 to engage with and mechanically lock the locking bars 2036 to locking bar engagement elements 2074 extending from the swing-arms 2020-1. The engagement between the locking bars 2036 and the locking bar engagement elements 2074 may be similar to that illustrated in and described by reference to FIGS. 9-12.

The handle wheel 2072 may be rotated in the opposite direction (e.g., counterclockwise) to deactivate the magnetic controller 2030 to demagnetize the securing devices 2034. The demagnetization may cause the securing devices 2034 to be unlocked and disengaged from the locking bars 2036 and linearly translated toward the magnetic controller 2030. An electronic control device (not shown) similar to the electronic control device 1100, but without the securing device 1116, may be used to authenticate an operator to lock and unlock the handle wheel 2072.

Figure 21:
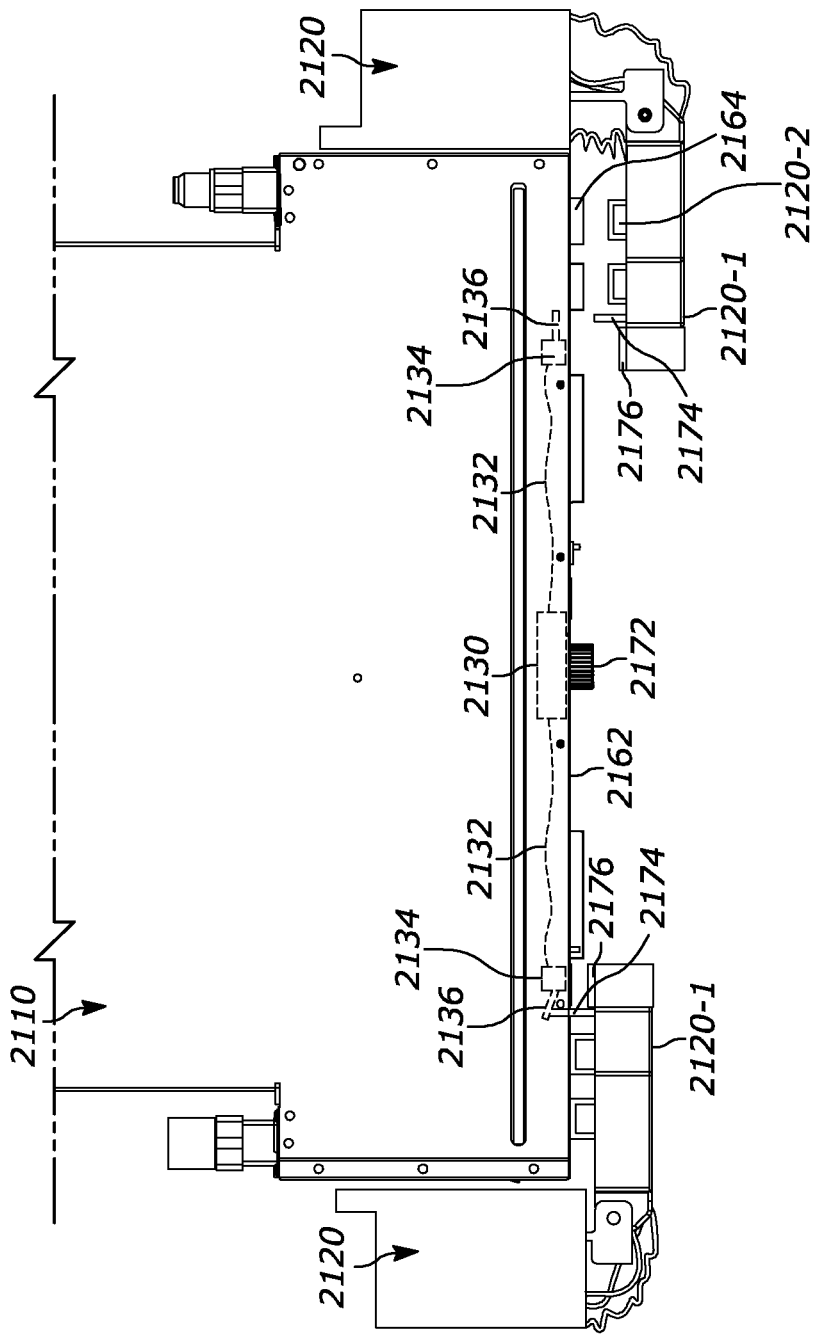
FIG. 21 is another partial top, plan view of a modular device assembly and swing-arm assemblies having a lock mechanism for faceplane infrastructure, according to one or more examples of the present disclosure.

FIG. 21 depicts a top view of a modular device assembly 2110 and swing-arm assemblies 2120 having a lock mechanism for faceplane infrastructure, according to one or more examples of the present disclosure. This variation utilizes an electromagnetic securing device controller 2130. Moreover, the securing device in this variation includes a magnet 2134 and a metal plate 2176 implemented as an electromagnetic lock. More particularly, the electromagnetic securing device controller 2130 may be coupled to electromagnetically controlled magnets 2134 via electrical wires 2132. The magnets 2134 each have a locking bar 2136 attached thereto or extending therefrom, and may be fixedly coupled within a modular device. In this variation, the locking bar 2136 acts as a switch to energize the magnet when moved to an angled position relative to the magnet 2136. Accordingly, hereinafter, the locking bar 2126 is referred to as a locking switch 2136. A handle wheel 2172 may be physically coupled to a faceplate 2162 and communicatively coupled to the electromagnetic securing device controller 2130. In an example, the handle wheel 2172 functions as a maintained switch.

The handle wheel 2172 may be rotated (e.g., clockwise) to signal the electromagnetic securing device controller 2130 to enable the magnets 2134 to lock the swing-arms 2120-1 when they are engaged with the locking switch 2136. When the swing-arms 2120-1 are in the closed and mated position, locking bar extension elements 2174 (which may be implemented as tabs and are thereby referred to herein as locking tabs 2174) extending from the swing-arms 2120-1 engage with the locking switches 2136. Upon engagement, the locking tabs 2174 move the locking switches 2136 from a straight position (as shown on the right side of the modular device assembly 2110) to the angled position (as shown on the left side of the modular device assembly 2110), thereby energizing the magnets 2134 to attract the metal plates 2176 that are attached to swing-arms 2120-1. This locks the swing-arms 2120-1 to the faceplate 2162. The faceplate 2162 may have an opening (not shown) for the magnets 2134 to be in direct contact with the metal plates 2176, when the faceplate 2162 is not metal.

The handle wheel 2172 may be rotated in the opposite direction (e.g., counterclockwise) to signal the electromagnetic securing device controller 2130 to de-energize the magnets 2134 and release the metal plates 2176, allowing swing-arms 2120-1 to be disengaged from the connectors 2164. An electronic control device (not shown) similar to the electronic control device 1100, but without the securing device 1116, may be used to authenticate an operator to lock and unlock the handle wheel 2172.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A lock mechanism for faceplane infrastructure arranged externally from a modular device, where the faceplane infrastructure is configured to be moveably coupled to a frame and/or rack cabinet that holds the modular device, the lock mechanism comprising:

a locking bar configured to be housed within the modular device and to removably engage a locking bar engagement element, the locking bar engaging element extending through an aperture in a faceplate of the modular device when the locking bar engagement element is in an engaged state with the locking bar, the locking bar engagement element being fixedly coupled to a first portion of the faceplane infrastructure; and an electronically controlled securing device configured to lock the first portion of the faceplane infrastructure to the faceplate of the modular device in the engaged state of the locking bar with the locking bar engagement element.

2. The lock mechanism of claim 1, wherein the first portion of the faceplane infrastructure comprises a swing-arm configured to move relative to the faceplate between a mated position and an unmated position, and the locking bar is configured to removably engage the locking bar engagement element in response to the swing-arm being placed in the mated position.

3. The lock mechanism of claim 2, wherein the locking bar engagement element comprises a slotted tab or a three-sided pocket into which a portion of the locking bar is received to removably engage the locking bar with the locking bar engagement element.

4. The lock mechanism of claim 1, wherein:
the first portion of the faceplane infrastructure comprises a swing-arm configured to move relative to the faceplate between a mated position and an unmated position,
the locking bar engagement element comprises a tab fixedly coupled to the swing-arm;
the locking bar comprises a locking switch movable in response to engagement with the tab; and
the securing device comprises a magnet configured to attract a metal plate fixedly coupled to the swing-arm, in response to the locking switch being in a first position, to lock the swing-arm to the faceplate.

5. The lock mechanism of claim 4, further comprising:
a control component coupled to an external surface of the faceplate; and
an electromagnetic securing device controller coupled to the control component and to the magnet and housed within the modular device, wherein the electromagnetic securing device controller controls the magnet to attract the metal plate, based on a position of the locking switch, to lock the swing-arm to the faceplate.

6. The lock mechanism of claim 1, further comprising:
a first control component coupled to an external surface of the faceplate; and
a second control component coupled to the first control component and housed within the modular device, wherein the second control component linearly translates the locking bar relative to an internal surface of the faceplate in response to movement of the first control component, the linear translation of the locking bar causing the locking bar to removably engage the locking bar engagement element on condition of the locking bar engagement element being received through the aperture in the faceplate.

7. The lock mechanism of claim 6,
wherein the securing device comprises an electronic securing device configured to linearly translate a securing element between first and second positions,
wherein in the first position the securing element secures the locking bar in an engaged position and in the second position the securing element allows movement of the locking bar to a disengaged position,
wherein the lock mechanism further comprises an electronic securing device controller configured to control the securing device.

8. The lock mechanism of claim 6,
wherein the securing device comprises a magnetic securing device configured to linearly translate the locking bar between an engaged position and a disengaged position,
wherein the second control component comprises a magnetic securing device controller configured to cause the securing device to linearly translate the between the engaged and disengaged positions in response to the movement of the first control component.

9. The lock mechanism of claim 1, further comprising an access control system configure to determine access to control the securing device.

10. The lock mechanism of claim 9, wherein the access control system comprises one or more of:
a fingerprint sensor;
a camera;
a tag reader;
a wireless interface; or
a manual access device.

11. The lock mechanism of claim 1, further comprising a cable lock device, comprising:
a clamp configured to route one or more cables of the faceplane infrastructure;
a clamp lock configured to lock the clamp around the one or more cables, wherein the clamp lock is fixedly coupled to the first portion of the faceplane infrastructure; and
a clamp tray onto which the clamp is mounted.

12. The lock mechanism of claim 11, wherein:
the first portion of the faceplane infrastructure comprises a swing-arm configured to move relative to the faceplate between a mated position and one or more unmated positions,
the clamp has a tip at an end portion of the clamp; and
the clamp lock extends from the swing-arm;
wherein the clamp lock is configured to engage with couples to the tip of the clamp to lock the clamp around the one or more cables when in a state of the swing-arm being locked to the faceplate of the modular device.

13. An apparatus for locking faceplane infrastructure arranged externally from a modular device, where the faceplane infrastructure is configured to be moveably coupled to a frame and/or rack cabinet that holds the modular device, the apparatus comprising:
a swing-arm assembly configured to be coupled to an exterior of a faceplate of a modular device, the swing-arm assembly comprising:
a plenum; and
a swing-arm coupled to the plenum and movable relative to the faceplate between a mated position and an unmated position; and
a lock mechanism comprising
a locking bar engagement element fixedly coupled to the swing-arm and configured to extend through an aperture in the faceplate of the modular device in a state of the swing-arm in the mated position;
wherein
the locking bar engagement element is removeably engagable with a locking bar housed within the modular device, in a state of the locking bar engagement element extending through the aperture in the faceplate of the modular device, to lock
the swing-arm to the faceplate of the modular device.

14. The apparatus of claim 13,
wherein the lock mechanism further comprises a clamp lock extending from the swing-arm,
wherein the clamp lock is configured to engage with a clamp of a cable lock device coupled externally to the faceplate of the modular device, in a state of the swing-arm being locked to the faceplate, to lock the clamp in a closed position, the cable lock device being configured to, in a state of the clamp being in the closed position, secure one or more cables or cable assemblies coupled to the faceplate of the modular device.

15. The apparatus of claim 14, wherein the cable lock device comprises:
a clamp tray coupled to the modular device; and
the clamp having a tip at an end of the clamp, wherein the clamp is mounted to the clamp tray;
wherein the clamp cable lock couples to is configured to engage the tip of the clamp to lock the clamp in the closed position.

16. An electronic device, comprising:
a modular device comprising:
a faceplate; and
a first connector;

a swing-arm assembly configured to be moveably coupled exterior of the modular device to a frame and/or rack cabinet that holds the modular device, the swing-arm assembly comprising:
  a plenum; and
  a swing-arm coupled to the plenum, the swing-arm containing a second connector and being movable, in a coupled state of the swing-arm assembly to the modular device, relative to the faceplate between a mated position and an unmated position, the first and second connectors being mated in the mated position of the swing-arm and being unmated in the unmated position of the swing-arm; and
a lock mechanism comprising:
  a locking bar housed within the modular device;
  a locking bar engagement element fixedly coupled to the swing-arm;
  a securing device;
  a securing device controller coupled to the securing device; and
  an access control system coupled to the securing device controller;
wherein, in a coupled state of the swing-arm assembly to the modular device and in the mated position of the swing-arm:
  the locking bar engagement element extends through an aperture in the faceplate and the locking bar is engageable with the locking bar engagement element;
  the access control system is configured to determine access to operate the securing device controller; and
  the securing device controller is configured to control the securing device to lock the swing-arm to the faceplate and to release the swing-arm from the faceplate, wherein in a state of the swing-arm being locked to the faceplate, the locking bar is engaged with the locking bar engagement element.

17. The electronic device of claim 16, further comprising:
a second modular device comprising:
  a second faceplate; and
  a third connector;
  wherein the swing-arm assembly comprises a second swing-arm coupled to the plenum, the second swing-arm containing a fourth connector and being movable, in a coupled state of the swing-arm assembly to the modular device, relative to the faceplate between a mated position and an unmated position, the third and fourth connectors being mated in the mated position of the second swing-arm and being unmated in the unmated position of the second swing-arm;
  wherein the lock mechanism comprises:
    a second locking bar housed within the second modular device;
    a second locking bar engagement element fixedly coupled to the second swing-arm;
    a second securing device;
    a second securing device controller coupled to the second securing device;
  wherein, in a coupled state of the swing-arm assembly to the modular device and in the mated position of the second swing-arm:
    the second locking bar engagement element extends through an aperture in the second faceplate and the second locking bar is engageable with the second locking bar engagement element through an aperture in the second faceplate; and
    the second securing device controller is configured to control the second securing device to lock the second swing-arm to the second faceplate and to release the second swing-arm from the second faceplate, wherein in a state of the second swing-arm being locked to the second faceplate, the second locking bar is engaged with the second locking bar engagement element.

18. The electronic device of claim 17, wherein the access control system is configured to determine access to operate the second securing device controller.

19. The electronic device of claim 17, further comprising a second access control system configured to determine access to operate the second securing device controller.

* * * * *